(12) United States Patent
Yano et al.

(10) Patent No.: US 8,704,217 B2
(45) Date of Patent: Apr. 22, 2014

(54) FIELD EFFECT TRANSISTOR, SEMICONDUCTOR DEVICE AND SEMICONDUCTOR DEVICE MANUFACTURING METHOD

(75) Inventors: Koki Yano, Sodegaura (JP); Kazuyoshi Inoue, Sodegaura (JP); Shigekazu Tomai, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 102 days.

(21) Appl. No.: 12/863,246

(22) PCT Filed: Jan. 16, 2009

(86) PCT No.: PCT/JP2009/050504
§ 371 (c)(1),
(2), (4) Date: Jul. 16, 2010

(87) PCT Pub. No.: WO2009/091013
PCT Pub. Date: Jul. 23, 2009

(65) Prior Publication Data
US 2011/0049511 A1    Mar. 3, 2011

(30) Foreign Application Priority Data
Jan. 17, 2008    (JP) ................. 2008-008393

(51) Int. Cl.
*H01L 29/10*    (2006.01)
*H01L 29/12*    (2006.01)
(52) U.S. Cl.
USPC ............... 257/43; 257/57; 438/365; 438/482

(58) Field of Classification Search
USPC ............... 257/43, 57; 438/365, 482
See application file for complete search history.

(56) References Cited

U.S. PATENT DOCUMENTS 6,338,988 B1 *   1/2002   Andry et al. ............ 438/158
7,001,814 B1 *   2/2006   Halliyal et al. ........... 438/287
(Continued)

FOREIGN PATENT DOCUMENTS

JP    200386808 A    3/2003
JP    2005268724 A   9/2005
(Continued)

OTHER PUBLICATIONS

World IP Organization. "International Preliminary Report on Patentability." PCT/JP2009/050504, Applicant: Idemitsu Kosan Co, Ltd., Mailed: Aug. 31, 2010.
World IP Organization. "International Search Report." PCT/JP2009/050504, Applicant: Idemitsu Kosan Co, Ltd., ISA; Japanese Patent Office, Mailed Feb. 17, 2009.

(Continued)

*Primary Examiner* — William D Coleman
*Assistant Examiner* — Nicholas Tobergte
(74) *Attorney, Agent, or Firm* — Miller, White, Zelano, Branigan, P.C.

(57) ABSTRACT

A field effect transistor including a source electrode 107*a*, a drain electrode 107*b*, a gate electrode 103, an insulating film 105 and a semiconductor layer 109 containing a crystalline oxide, wherein the source electrode 107*a* and the drain electrode 107*b* are self-aligned with the gate electrode 103 with the insulating film 105 therebetween.

20 Claims, 12 Drawing Sheets

(56) References Cited

U.S. PATENT DOCUMENTS

| | | | |
|---|---|---|---|
| 7,061,014 B2 * | 6/2006 | Hosono et al. | 257/43 |
| 7,674,650 B2 * | 3/2010 | Akimoto et al. | 438/104 |
| 7,737,517 B2 * | 6/2010 | Kawamura et al. | 257/432 |
| 8,164,090 B2 * | 4/2012 | Iwasaki et al. | 257/43 |
| 8,203,143 B2 * | 6/2012 | Imai | 257/43 |
| 2003/0047785 A1 * | 3/2003 | Kawasaki et al. | 257/350 |
| 2005/0199959 A1 | 9/2005 | Chiang et al. | |
| 2009/0065771 A1 | 3/2009 | Iwasaki et al. | |

FOREIGN PATENT DOCUMENTS

| | | |
|---|---|---|
| JP | 2006165527 A | 6/2006 |
| JP | 2007005508 A | 1/2007 |
| JP | 200735964 A | 2/2007 |
| JP | 2007123861 A | 5/2007 |
| JP | 2007250983 A | 9/2007 |
| WO | 2007058248 A1 | 5/2007 |

OTHER PUBLICATIONS

Patent Abstracts of Japan-JPO. "English abstract—Thin Film Transistor and Manufacturing Method Thereof, and Display Device." JP200735964A, Applicant: Sony Corp. Feb. 8, 2007.

Patent Abstracts of Japan-JPO. "English abstract—Method for Manufacturing Thin Film Transistor and for Display Device." JP2007005508A, Applicant: Sony Corp., Jan. 11, 2007.

Patent Abstracts of Japan-JPO. "English abstract—Field Effect Transistor." JP2006165527A, Applicant: Canon Inc., Jun. 22, 2006.

Patent Abstracts of Japan-JPO. "English abstract—Electronic Element and Method for Manufacturing Same." JP2005268724A, Applicant: Sony Corp. Sep. 29, 2005.

Espacenet Database. "English abstract—Semiconductor Device and its Manufacturing Method." JP2007123861A, Applicant: Semiconductor Energy Lab, May 17, 2007.

* cited by examiner

Exposure

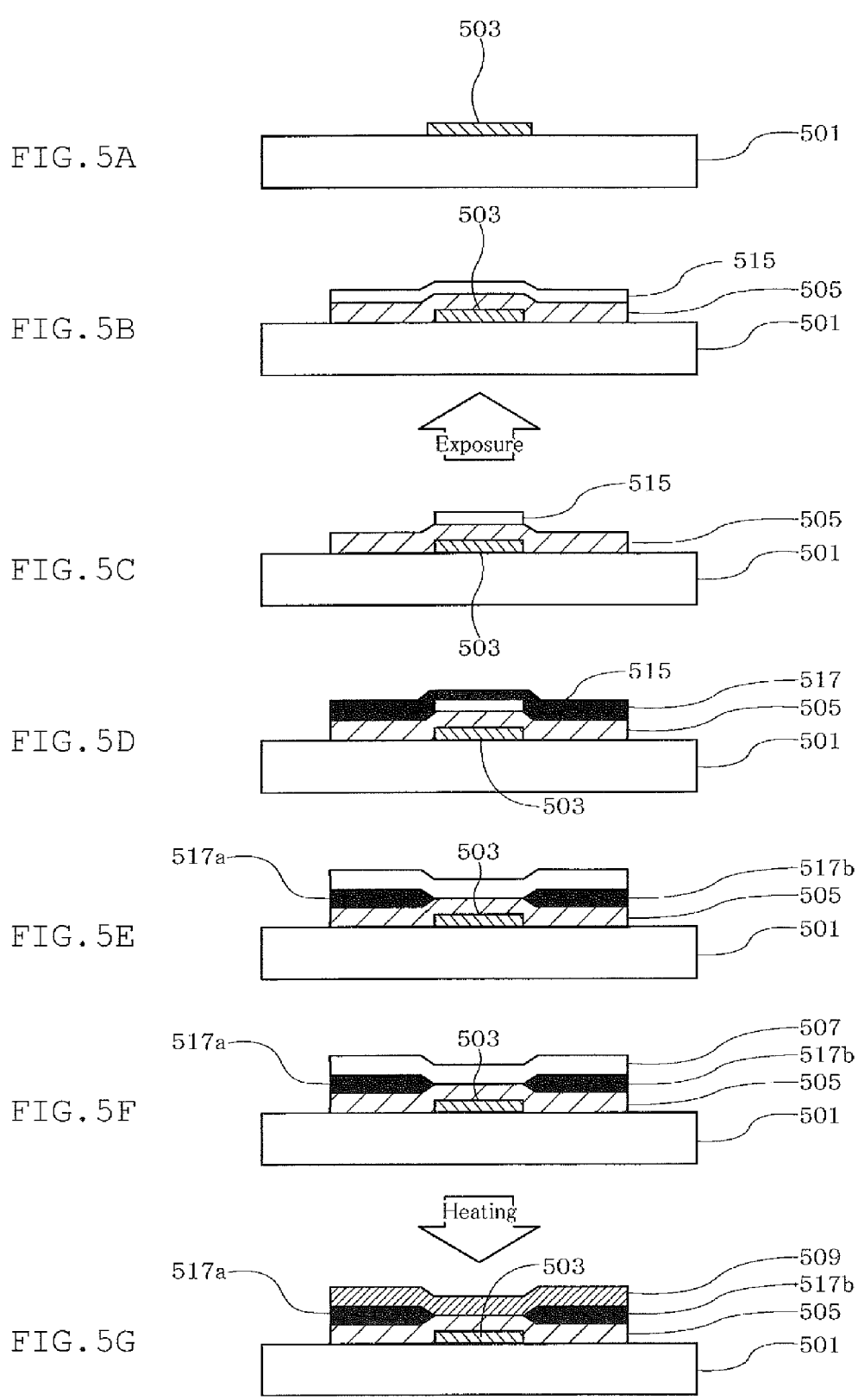

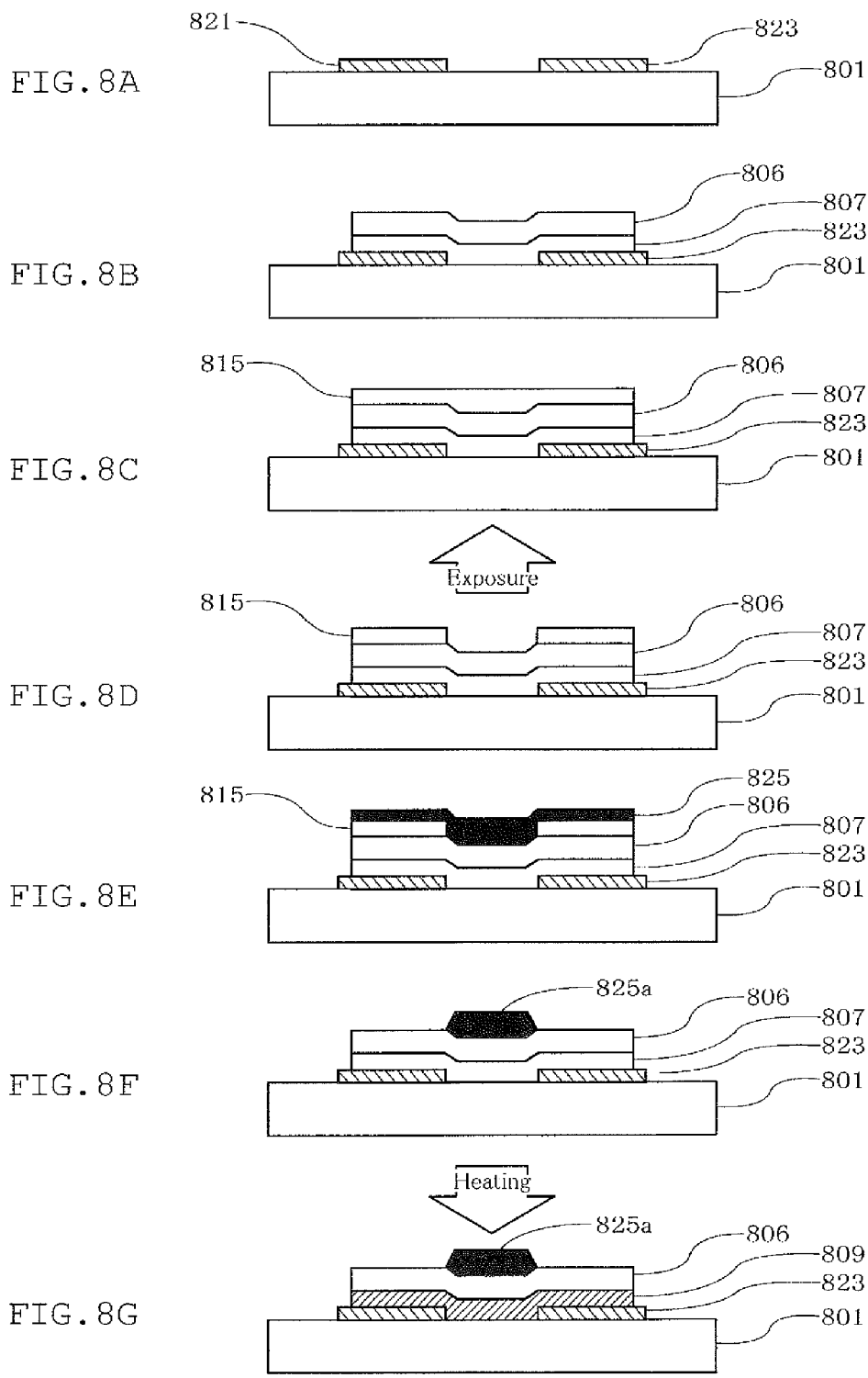

FIELD EFFECT TRANSISTOR, SEMICONDUCTOR DEVICE AND SEMICONDUCTOR DEVICE MANUFACTURING METHOD

TECHNICAL FIELD

The invention relates to a field effect transistor having an oxide film as a semiconductor layer and a production method thereof, and to a semiconductor device provided with the field effect transistor. In particular, the invention relates to a field effect transistor which has transistor properties capable of being applied to displays or the like.

A field effect transistor is a device which is widely used as a unit electronic element of a semiconductor memory integrated circuit, a high-frequency signal amplification element, a liquid crystal driving element or the like. It is an electronic device which is most practically used in recent years.

Of field effect transistors, with a significant development in displays in recent years, not only in liquid crystal displays (LCD) but also in various displays such as electroluminescence displays (EL) and field emission displays (FED), a thin film transistor (TFT) has been widely used as a switching element for driving a display by applying a driving voltage to a display element.

As the material thereof, a silicon semiconductor is most widely used. In general, a silicon single crystal is used in a high-frequency amplification element, an integrated circuit element or the like, which require high-speed operation. In a liquid crystal driving element or the like, amorphous silicon is used to meet the requirement for an increase in area.

However, a crystalline silicon-based thin film is required to be heated at a high temperature, for example, 800° C. or higher, for crystallization. Therefore, it is difficult to form a crystalline silicon-based thin film on a glass substrate or on a substrate formed of an organic substance. Therefore, a crystalline silicon-based thin film could be formed only on an expensive substrate having a high thermal resistance such as silicon wafer and quartz. In addition, there was a problem that a large amount of energy and a large number of steps were required in production.

Further, since a crystalline silicon-based thin film is normally restricted to a TFT with a top-gate configuration, a reduction in production cost such as a decrease in number of masks was difficult.

On the other hand, an amorphous silicon semiconductor (amorphous silicon) which can be formed into a film at a relatively low temperature has a lower switching speed as compared with a crystalline silicon semiconductor. Therefore, when used as a switching element for driving a display, a problem may arise that a high-speed animation cannot be displayed.

In order to overcome these defects, an attempt has been made to allow an amorphous silicon film to be a finely crystalline silicon film. However, since the temperature of amorphous silicon is required to be higher than the melting point (1410° C.) of silicon, there were problems such as occurrence of hillock when an Al-based material is used, limited selection of peripheral components such as impossibility of using a low-melting material, easy occurrence of thermal distribution which makes uniform heating difficult and restriction on heating apparatuses since a treatment takes a prolonged period of time unless a high power laser is used (Patent Documents 1 and 2).

Today, as a switching element for driving a display, a device using a silicon-based semiconductor layer constitutes the mainstream due to various excellent performances including improved stability and processability of a silicon thin film and a high switching speed. Such a silicon-based thin film is generally produced by the chemical vapor deposition (CVD) method.

Some conventional thin film transistors (TFT) have an inverted-staggered structure in which, on a substrate formed of glass or the like, a gate electrode, a gate-insulating layer, a semiconductor layer such as a hydrogenated amorphous silicon (a-Si:H) film, a source electrode and a drain electrode are stacked. This inverted-staggered type TFT is used, in a field of large-area devices including an image sensor, as a driving element for flat panel displays represented by active matrix-type liquid crystal displays. In these applications, with an improvement in function, an increase in operation speed is demanded even for conventional TFTs using amorphous silicon.

Under such circumstances, in recent years, an oxide semiconductor thin film using an oxide has attracted attention as a film which has stability superior to that of a silicon-based semiconductor thin film.

However, of transparent semiconductor thin films formed of such metal oxide, in particular, a transparent semiconductor thin film obtained by crystallizing zinc oxide at a high temperature has a field effect mobility as low as 1 $cm^2/V \cdot sec$ and a small on-off ratio. Further, since current leakage tends to generate easily, practical application on the industrial scale was difficult. Many studies have been made on an oxide semiconductor containing crystalline substances obtained by using zinc oxide. If film formation is conducted by a sputtering method which is generally conducted on the industrial scale, the following problems may occur.

That is, a TFT may have deteriorated performance such as a low mobility, a small on-off ratio, a large amount of current leakage, unclear pinch-off and tendency of becoming normally-on. In addition, since it has poor chemicals resistance, the production process or the use environment was limited such as difficulty in wet etching. Further, in order to improve the performance, film formation was required to be conducted at a higher pressure, which caused industrial application to be difficult due to a lower film-forming speed and a higher treatment temperature exceeding 700° C. Further, TFT performance such as field mobility in a bottom-gate configuration was poor. In order to improve the performance, the film thickness was required to be 50 nm or more in a top-gate configuration, which restricted the TFT device structure (Patent Document 3).

In order to solve such problems, studies have been made on a method for driving a thin film transistor in which an amorphous oxide semiconductor film composed of indium oxide, gallium oxide and zinc oxide or an amorphous oxide semiconductor film composed of indium oxide and zinc oxide is formed to drive a thin film transistor (Patent Document 4).

However, as a result of studying a thin film transistor using an oxide semiconductor, it was found that the transistor properties (Id-Vg properties) of a TFT may vary depending on the composition or production conditions. Such variation in properties of a TFT, when a TFT is used in a pixel circuit of a display or the like, causes operation of an organic EL, a liquid crystal or the like which is to be driven by a TFT to vary, and finally, causes image quality of a display to be deteriorated.

In order to solve these problems, an attempt has been made to prepare a transistor in which a gate electrode is self-aligned with source/drain electrodes by injecting ions to an amorphous oxide semiconductor. However, if ion injection is used, a problem occurred that the transistor performance significantly deteriorated since injected ions scattered to cause a lowering in mobility, defects occurred in a gate-insulating film to increase gate leakage, traps were generated at the interface to increase the threshold voltage and properties were changed due to the move of injected ions by the stress of driving. In addition, facilities for ion injection could not be put into practical use since they were difficult to increase in size and the production cost thereof was high (Patent Document 5). Further, although studies had been made on a self-alignment type thin film transistor produced by the lift-off process using an amorphous oxide semiconductor, working accuracy was low due to the need of the lift-off process, variations in performance were significant, and reliability was low since the semiconductor layer was amorphous (Patent Document 6).

Further, an attempt was made to prepare a field effect transistor by increasing the resistance of a conductive amorphous oxide film to allow it to be a crystalline semiconductor layer (Patent Document 7) or by heating the gate electrode to improve crystalline property of the crystalline oxide semiconductor (Patent Document 8).

Patent Document 1: JP-A-2007-5508
Patent Document 2: JP-A-2007-35964
Patent Document 3: JP-A-2003-86808
Patent Document 4: U.S.P. 2005/0199959
Patent Document 5: JP-A-2007-250983
Patent Document 6: JP-A-2006-165527
Patent Document 7: WO2007/058248
Patent Document 8: JP-A-2007-123861

The invention has been made in view of the above-mentioned circumstances, and an object of the invention is to decrease the above-mentioned variation in properties. These variations appear to be caused by
1) parasitic resistance generated between source/drain electrodes and a channel; and
2) variations in positional relationship between a gate electrode, a source electrode and a drain electrode.

A first object of the invention is to provide a field effect transistor in which a gate electrode, a source electrode and a drain electrode are relatively positioned with a high accuracy, thereby decreasing the above-mentioned variation in properties.

DISCLOSURE OF THE INVENTION

The field effect transistor of the invention is provided with a source electrode, a drain electrode, a gate electrode, an insulating film and a semiconductor layer containing a crystalline oxide, and the source electrode and the drain electrode are self-aligned with the gate electrode with an insulating film therebetween.

Self-alignment is that the source electrode and the drain electrode do not substantially overlap the gate electrode. In the self-alignment of the invention, overlapping of the source electrode or the drain electrode with the gate electrode is normally 3.0 μm or less, preferably 2.0 μm or less, more preferably 1.0 μm or less, further preferably 0.5 μm or less, and particularly preferably 0.2 μm or less. If the overlapping is larger than 3.0 μm, the parasitic resistance is increased to cause the circuit operation to be slow.

If the gate electrode is not produced such that it is self-aligned with the source/drain electrodes, the overlapping of the gate electrode and the source/drain electrode may vary due to an error in mask alignment. If the overlapping of the gate electrode and the source/drain electrodes varies, the capacitance between them may vary, thereby causing uneven display in a display.

In the field effect transistor of the invention, for example, the semiconductor layer may be positioned between the source electrode and the drain electrode, or between the source electrode and the drain electrode, and the gate electrode, or on the source electrode and the drain electrode (on the side opposite to the gate electrode).

When the source electrode, the drain electrode and the semiconductor layer are formed of the same conductive amorphous oxide film, that is, when the semiconductor layer is obtained by crystallizing a conductive amorphous oxide film forming the source electrode and the drain electrode, the source electrode and the drain electrode have almost the same composition as that of the semiconductor layer.

The "having almost the same composition" means that the composition ratio of elements except for oxygen is almost similar. The almost similar composition ratio of elements except for oxygen can be confirmed by an analysis such as ICP. If the composition ratio of the elements is not almost the same, there is a possibility that elements move between the source electrode or the drain electrode and the active layer, whereby properties may change, or contact resistance may occur to cause deterioration of properties.

There are no particular restrictions on the material for forming each of the source electrode and the drain electrode. Materials which are commonly used can be arbitrary used as far as they do not impair the advantageous effects of the invention. For example, transparent electrodes such as indium tin oxide (ITO), indium zinc oxide, ZnO and $SnO_2$, metal electrodes such as Al, Ag, Cr, Ni, Mo, Au, Ti, Ta, Cu, W and Nb or metal electrodes of alloys containing these metals can be used. In addition, it is preferred that two or more of these be stacked to decrease contact resistance or to improve interfacial strength. Further, in order to decrease the contact resistance of the source electrode and the drain electrode, the interface between the semiconductor and the electrode is subjected to a plasma treatment, an ozone treatment or the like to adjust the resistance.

There are no particular restrictions on the material for forming the gate electrode. Materials which are commonly used can be arbitrary used as far as they do not impair the advantageous effects of the invention. For example, transparent electrodes such as indium tin oxide (ITO), indium zinc oxide, ZnO and $SnO_2$, metal electrodes such as Al, Ag, Cr, Ni, Mo, Au, Ti, Ta, Cu, W and Nb, or metal electrodes of alloys containing these metals can be used. In addition, it is preferred that two or more of these be stacked to decrease contact resistance or to improve interfacial strength. When the gate electrode is heated, as the material of the gate electrode, a material which is easy to be heated, i.e., one having a low reflectance and a high thermal absorption rate, or the like, is desirable. For that purpose, metals or alloys are preferable. It is also preferable to lower the reflectance by subjecting it to a surface treatment.

There are no particular restrictions on the material for forming the gate insulating film. Materials which are commonly used can be arbitrary used as far as they do not impair the advantageous effects of the invention. For example, oxides such as $SiO_2$, SiNx, $Al_2O_3$, $Te_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN or the like may be used. Of these, $SiO_2$, SiNx, $Al_2O_3$, $Y_2O_3$, $Hf_2O_3$ and $CaHfO_3$ are preferably used, with $SiO_2$, SiNx, $Y_2O_3$, $Hf_2O_3$ and $CaHfO_3$ being more preferable. The oxygen number of these oxides may not necessarily coincide with the stoichiometrical ratio (for example, they may be $SiO_2$ or SiOx).

The gate insulating film may be a stack structure in which two or more different insulating films are stacked. The gate insulating film may be crystalline, polycrystalline or amorphous. It is preferred that the gate insulating film be polycrystalline or amorphous since it can be produced easily on the industrial scale.

The crystalline oxide in the semiconductor layer preferably comprises at least In. If it contains an indium element, the content of the indium element relative to all atoms excluding oxygen is preferably 87 at % or more and 100 at % or less, and more preferably 90 at % or more and 99 at % or less. If the content of the indium element is less than 87 at %, the crystallization temperature of the crystalline layer may be increased to cause crystals to be ununiform, or the mobility of the resulting thin film transistor may be lowered.

It is more preferred that the crystalline oxide be a composite oxide which contains two or more elements other than oxygen.

It is preferred that the crystalline oxide further contain one or more positive divalent metal elements. The positive divalent metal element is an element which can take an atomic valency of positive divalency in the ionic state. If the crystalline oxide contains indium which is a positive trivalent metal element and a positive divalent metal element, electrons generated by oxygen deficiency can be suppressed during crystallization, whereby carrier density can be kept low.

Examples of the positive divalent metal element include Zn, Be, Mg, Ca, Sr, Ba, Ti, V, Cr, Mn, Fe, Co, Ni, Pd, Pt, Cu, Ag, Cd, Hg, Sm, Eu and Yb. In respect of effective control of carrier concentration, Zn, Mg, Mn, Co, Ni, Cu and Ca are preferable.

Of the above-mentioned preferable positive divalent metal elements, in respect of carrier control effects by the addition, Cu and Ni are more preferable. In respect of transmittance and the width of a band gap, Zn and Mg are more preferable.

These positive divalent metal elements may be used in combination of two or more as far as they do not impair the advantageous effects of the invention.

Further, it is preferred that the crystalline oxide be a composite oxide containing two or more elements in addition to oxygen. Preferably, the crystalline oxide further contains one or more positive trivalent metal elements. The positive trivalent metal element means an element which can take an atomic valency of positive trivalency in the ionic state.

Examples of the positive trivalent metal element include Ga, Al, La, Ce, Pr, Nd, Pm, Sm, Eu, Gd, Tb, Dy, Ho, Er, Tm, Yb and Lu.

If the crystalline oxide contains an indium element and a positive divalent or trivalent metal element, the atomic ratio [X/(X+In)] of indium [In] to the positive divalent or trivalent metal element [X] is preferably 0.0001 to 0.13.

If the atomic ratio [X/(X+In)] is less than 0.0001, the number of carriers may not be controlled since the content of the divalent metal element is small. On the other hand, if the atomic ratio [X/(X+In)] exceeds 0.13, problems may arise that the interface between the crystalline layer and the amorphous layer or the surface of the crystalline layer may be denatured easily and become unstable, the crystallization temperature may be increased to make crystallization difficult, the carrier concentration may be increased, the hall mobility may be lowered, the threshold voltage may be varied when a transistor is driven, or the driving may be unstable.

If the semiconductor layer contains indium oxide and an oxide of a positive divalent or trivalent metal element, the total amount of indium oxide and the oxide of a positive divalent or trivalent metal element is normally 50 mass %, preferably 65 mass % or more, more preferably 80 mass % or more, still more preferably 90 mass % or more and particularly preferably 95 mass % or more relative to the semiconductor layer. If the total amount of indium oxide and the oxide of a positive divalent or trivalent metal element is less than 50 mass %, the mobility of the semiconductor layer may be lowered or other problems occur, thereby preventing the advantageous effects of the invention from being sufficiently exhibited.

The crystalline oxide may contain both a positive divalent element and a positive trivalent element.

If it further contains a slight amount of a positive tetravalent metal element such as Sn, since the positive divalent metal element such as Zn is well-balanced in valency number relative to indium, which is a positive trivalent metal element, crystallization can be preferably attained easily. However, if the crystalline layer contains a large amount of a positive tetravalent metal element, the carrier density may become too large, causing the off current to be increased when used in a thin film transistor. The content of the positive tetravalent metal element is preferably 0.01 at % to 10 at % of the positive trivalent metal element contained in the crystalline oxide.

If the content of the positive tetravalent metal element is defined by mass, the content of the positive tetravalent metal element is preferably 3 mass % or less, more preferably 2 mass % or less and particularly preferably 1 mass % or less, relative to the mass of the entire crystalline oxide. If the content of the positive tetravalent metal element exceeds 3 mass %, the carrier density may not be controlled to low.

For example, if the crystalline oxide contains indium, zinc (positive divalent metal element), gallium (positive trivalent metal element) and tin (positive tetravalent metal element), a high mobility can be realized.

It is preferred that the crystalline oxide show a bixbite structure.

If the crystalline oxide does not show a bixbite structure, the number of corner-sharing structure is increased due to the edge-sharing structure. As a result, the overlapping of the s-orbit of a metal is decreased, whereby mobility may be lowered. In addition, hall mobility can be increased by a bixbite structure. Further, due to a bixbite structure, resistance to a wet etching solution containing hydrofluoric acid or ammonium fluoride is increased. A crystalline oxide having a bixbite structure is especially preferable when forming a bottom-gate type self-aligned transistor. The bixbite type crystalline structure can be confirmed by X-ray diffraction.

The crystal particle size is normally 300 nm or less, preferably 100 nm or less, more preferably 50 nm or less, and further preferably 30 nm or less. If the crystal particle size is larger than 300 nm, when the size of a field effect transistor is miniaturized, variations in properties among field effect transistors may be large.

It is preferred that the semiconductor layer have an electron carrier concentration of $10^{13}$ to $10^{18}/cm^3$. If the electron carrier concentration exceeds $10^{18}/cm^3$, a transistor may have a higher off current. If the electron carrier concentration is smaller than $10^{13}/cm^3$, the mobility of a transistor may be lowered.

It is preferred that the specific resistance of the semiconductor layer be $10^{-2}$ to $10^8$ Ωcm, more preferably $10^{-1}$ to $10^6$ Ωcm, and further preferably $10^0$ to $10^4$ Ωcm. If the specific resistance is smaller than $10^{-2}$ Ωcm, a transistor may have a higher off current when the semiconductor layer is used in a TFT. If the specific resistance exceeds $10^8$ Ωcm, the mobility of a transistor may be lowered.

It is preferred that the semiconductor layer have a band gap of 2.0 to 6.0 eV, more preferably 2.8 to 4.8 eV. If the band gap is smaller than 2.0 eV, visible rays may be absorbed to cause a field effect transistor to malfunction. If the band gap is larger than 6.0 eV, a field effect transistor may not function.

It is preferred that the semiconductor layer be a nondegenerate semiconductor which shows thermal activity. If the semiconductor layer is a degenerate semiconductor, the off current/gate leakage current may be increased due to an excessive amount of carriers, or the threshold value may become negative to cause a transistor to be normally-on.

The surface roughness (RMS) of the semiconductor layer is preferably 1 nm or less, more preferably 0.6 nm or less, with 0.3 nm or less being particularly preferable. If the surface roughness is larger than 1 nm, the mobility may be lowered.

The film thickness of the semiconductor layer is normally 0.5 to 500 nm, preferably 1 to 150 nm, more preferably 3 to 80 nm, and particularly preferably 10 to 60 nm. If the film thickness is smaller than 0.5 nm, it is difficult to form an uniform film on the industrial scale. On the other hand, if the film thickness is larger than 500 nm, the film forming time is prolonged, thereby making industrial application impossible. If the film thickness is within a range of 3 to 80 nm, TFT properties such as the mobility and the on-off ratio are particularly good.

It is preferred that the semiconductor layer be protected by a protective layer. Without the protective film, the properties may be adversely affected by a process environment or an environment during use, and hence, deteriorated.

There are no particular restrictions on the material for forming the protective layer. Materials which are commonly used can be arbitrary used as far as they do not impair the advantageous effects of the invention. For example, oxides such as $SiO_2$, SiNx, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN or the like may be used. Of these, $SiO_2$, SiNx, $Al_2O_3$, $Y_2O_3$, $Hf_2O_3$ and $CaHfO_3$ are preferably used, with $SiO_2$, SiNx, $Y_2O_3$, $Hf_2O_3$ and $CaHfO_3$ being more preferable. The oxygen number of these oxides may not necessarily coincide with the stoichiometrical ratio (for example, they may be $SiO_2$ or SiOx). Further, it may further contain hydrogen such as SiNx:H.

It is preferred that such protective film be a stack structure in which two or more different insulating films are stacked. The protective film may be crystalline, polycrystalline or amorphous. It is preferred that the protective film be polycrystalline or amorphous since it can be produced easily on the industrial scale.

It is preferred that the field effect transistor have a structure capable of shielding the semiconductor layer from light. If it does not have a structure capable of shielding the semiconductor layer from light (light-shielding layer), carrier electrons may be excited when exposed to light, resulting in an increased off current. The light-shielding layer may be a thin film having a large absorption at a wavelength equal to or smaller than 500 nm. The light-shielding layer may be positioned above or below the semiconductor layer. However, it is preferred that the light-shielding layer be provided both above and below the semiconductor layer. The gate insulating film, a black matrix or the like may be used as the light-shielding layer. If the light-shielding layer is provided on only either above or below, it is preferable to contrive the structure in order not to allow light to be irradiated from the side on which no light-shielding layer is provided.

Although the field effect transistor of the invention is normally formed on a substrate, there are no particular restrictions on the substrate. Substrates which are commonly used can be arbitrarily selected as far as they do not impair the advantageous effects of the invention. For example, glass substrates such as those formed of non-alkaline glass, soda-lime glass and quartz glass, resin substrates, or a metal thin film (foil) substrate can be used. As the resin substrate, plastics (synthetic resin) such as polyethylene terephthalate (PET), polyethylene naphthalate (PEN), polyether sulfone (PES), acrylic resins, polyimides or the like can be used. A single crystal substrate such as an Si substrate is difficult to be increased in size, and may cause the production cost to be increased.

The ratio (W/L) of the channel width W and the channel length L of the field effect transistor is normally 0.1 to 100, preferably 1 to 20 and particularly preferably 2 to 8. If the W/L exceeds 100, the current leakage may be increased or the on-off ratio may be decreased. If the W/L is smaller than 0.1, the field effect mobility may be lowered or the pinch off may be unclear.

Further, the channel length L is normally 0.1 to 1000 μm, preferably 1 to 100 μm, more preferably 2 to 10 μm. If the channel length is 0.1 μm or less, it is difficult to produce the transistor on the industrial scale, and the current leakage may be increased. A channel length of 1000 μm or more is not preferable since it makes the device too large in size.

The mobility of the field effect transistor is preferably 1 $cm^2/Vs$ or more, more preferably 3 $cm^2/Vs$ or more, and particularly preferably 8 $cm^2/Vs$ or more. If the mobility is smaller than 1 $cm^2/Vs$, the switching speed may be too slow to be used in a large-area, high-precise display.

The on-off ratio is preferably $10^6$ or more, more preferably $10^7$ or more, and particularly preferably $10^8$ or more.

The off current is preferably 2 pA or less, more preferably 1 pA or less. When the off current is larger than 2 pA, the gate leakage current is preferably 1 pA or less.

The threshold voltage is preferably 0 to 4 V, more preferably 0 to 3 V, and particularly preferably 0 to 2 V. If the threshold voltage is smaller than 0, the transistor may become normally-on, and a voltage may be required to be applied when the transistor is in the off state, which may increase consumption power. If the threshold voltage is larger than 5 V, the driving voltage may be increased, resulting in an increase in consumption power.

The S value is preferably 0.8 V/dec or less, more preferably 0.3 V/dec or less, still more preferably 0.25 V/dec or less, and particularly preferably 0.2 V/dec or less. If the S value is larger than 0.8 V/dec, the driving voltage may become large to increase the consumption power. In particular, when used in an organic EL display, which is driven by DC, it is particularly preferable to allow the S value to be 0.3 V/dec or less since the consumption power can be significantly decreased.

The shift amount in threshold voltage before and after the application of a direct voltage of 3 μA at 60° C. for 100 hours is preferably 1.0 V or less, more preferably 0.5 V or less. If the shift amount exceeds 1 V, the image quality may be deteriorated when used in a transistor of an organic EL display.

It is preferred that hysteresis when the gate voltage is increased or decreased in a transmission curve or a variation in threshold voltage when measured in air (variation in surrounding atmosphere) be small.

It is preferred that the field effect transistor of the invention have a coplanar structure.

A coplanar transistor means a transistor in which the gate electrode and the source/drain electrode are on the same side of the semiconductor layer, the semiconductor layer and the source/drain electrode are on the same plane, or the semiconductor layer and the source/drain electrode are not in contact with each other on a surface which is in parallel with the substrate. The inverted type of a transistor is called a staggered transistor. In the case of a staggered transistor, since an electric field is applied in a curved manner, a trap may be generated in the semiconductor interface or the gate insulating film, whereby the transistor properties such as mobility, threshold voltage and S value may be deteriorated. In addition, contact resistance may be generated in the interface between the semiconductor layer and the source/drain electrode, transistor properties such as mobility, threshold voltage, S value and hysteresis may be lowered.

As long as it is of a coplanar structure, the transistor may have any of the conventional structures such as a top-gate type structure and a bottom-gate type structure. However, a bottom-gate type structure is preferable. In the case of a bottom-gate type structure, it is preferred that the semiconductor layer be protected by a protective layer.

The semiconductor device of the invention is provided with the above-mentioned field effect transistor and has a conductor which is in contact with the source electrode and the drain electrode of the field effect transistor.

Since the gate electrode is heated by means of a lamp in order to heat a part overlapping with the gate electrode, it is preferred that the gate electrode have a lower reflectance to light emitted from the lamp as compared with a conductor. In addition, since the gate electrode is heated by means of a lamp in order to heat a part overlapping the gate electrode, it is preferred that the gate electrode have a higher thermal absorption as compared with a conductor.

It is preferred that the conductor contain as a main component one or a plurality of metals selected from Al, Ti, Cu, Au, Ag, Mc, Ni, Ta, Zr, Cr, Co, Cu, Nb and W.

The semiconductor device of the invention can be used as a display element such as an electroluminescence device, a liquid crystal cell or the like. The source part and the drain part of the field effect transistor are electrically connected to the electrode (conductor) of the display element. A plurality of such display elements are provided two-dimensionally on a substrate, whereby a display apparatus can be formed.

In the production method of the invention, a gate electrode is formed, an insulating film is formed on the gate electrode, a conductive amorphous oxide film is formed on the insulating film, and the gate electrode is heated using a pattern of the gate electrode as a mask, and a part of the conductive amorphous oxide film which overlaps the gate electrode is crystallized to allow it to be semiconductive, and a source electrode and a gate electrode are formed from a part of the conductive amorphous oxide film which does not overlap the gate electrode, whereby a bottom-gate type field effect transistor can be produced.

Here, the conductive oxide means an oxide having a specific resistance of less than $10^{-2}$ Ωcm and the semiconductor means an oxide having a specific resistance of $10^{-2}$ to $10^8$ Ωcm.

As the method for heating the gate electrode, known heating methods such as lamp heating, semiconductor laser heating, excimer laser heating, electromagnetic induction heating and plasma jet heating or the like can be used without restrictions. Lamp heating (lamp rapid thermal anneal, LRTA) and semiconductor laser heating are preferable since uniform heating is possible. Lamp heating which can heat a large area is particularly preferable.

As for the wavelength of light to be irradiated, it is preferable to use a wavelength in the ultraviolet region, the visible region or the infrared region. It is more preferable to use a wavelength in a wavelength region of 100 nm to 2400 nm. As the lamp light, it is preferable to use lamp light with a wavelength in the visible region or the infrared region. It is more preferable to use a wavelength in a wavelength region of 800 nm to 2400 nm.

It is preferred that solid phase crystallization be conducted. When melt crystallization is carried out, there is a possibility that oxygen may be removed and the thin film may be conductive. It is preferred that the crystallization be conducted at a temperature of 200 to 1400° C. At a temperature of 200° C. or lower, crystallization may not be attained easily or crystallization may take too long time. At a temperature 1400° C. or higher, oxygen may be removed to allow the film to be conductive. Solid phase crystallization is crystallization in which a substance is crystallized from an amorphous state to a crystallized state as a solid without being molten.

The lamp heating (LRTA) is conducted at 230 to 700° C. (preferably 250 to 570° C., more preferably 300 to 570° C., further preferably 350 to 470° C.) for 0.1 to 240 minutes (preferably 0.5 to 120 minutes, further preferably 1 to 30 minutes). The lamp heating (LRTA) can be conducted by radiation from one or a plurality of lamps selected from a halogen lamp, a metal halide lamp, a xenon arc lamp, a carbon arc lamp, a high-pressure sodium lamp and a high-pressure mercury lamp. Since the LRTA method is capable of conducting a heat treatment for a short period of time, it is possible to use a material having a relatively low melting point if the reflectance or transmittance of the wiring is higher than that of the gate electrode. In the lamp heating (LRTA) method, light with a wavelength in the infrared region, visible region, ultraviolet region or the like can be used. A heat treatment may be conducted by irradiating laser light instead of lamp heating (LRTA). As the laser light, for example, an infrared laser, a visible laser, an ultraviolet laser or the like can be used. The crystalline property of the oxide semiconductor film may be selectively improved by combining lamp heating (LRTA) and laser light irradiation.

If laser beam irradiation is conducted, it is possible to use beam from a continuous oscillation type laser (CW laser beam) or beam from a pulse oscillation type laser (pulse laser beam). As the laser beam, light oscillated from one or a plurality of lasers can be used.

A gas laser such as Ar lasers, Kr lasers and excimer lasers

A laser using a medium obtained by adding one or more elements selected from Nd, Yb, Cr, Ti, Ho, Er, Tm and Ta as a dopant to monocrystalline YAG, YVO$_4$, forsterite (Mg$_2$SiO$_4$), YAlO$_3$, GdVO$_4$ or a polycrystalline ceramic YAG, Y$_2$O$_3$, YVO$_4$, YAlO$_3$ and GdVO$_4$; and A glass laser, a ruby laser, an alexandrite laser, a Ti:sapphire laser, a copper vapor laser or a gold vapor laser.

By irradiating fundamental waves of such laser beam and the second to fourth harmonic wave of these fundamental waves, it is possible to improve crystalline properties of the oxide semiconductor layer. It is preferable to use laser light having energy larger than the band gap of the oxide semiconductor layer. For example, laser light emitted from an excimer laser oscillator such as KrF, ArF, XeCl or XeF is used.

In the production method of the invention, a gate electrode is formed, an insulating film is formed on the gate electrode, a conductive amorphous oxide film is formed on the insulating film, the conductive amorphous oxide film is crystallized by heating to allow it to be semiconductive, a source electrode and a drain electrode are formed using a pattern of the gate electrode as a mask, whereby a bottom-gate type field effect transistor can be produced.

In the production method of the invention, a conductive amorphous oxide film is formed, an insulating film is formed on the conductive amorphous oxide film, a gate electrode is formed on the insulating film, a part of the conductive amorphous oxide film which overlaps the gate electrode is crystallized by heating the gate electrode using a pattern of the gate electrode as a mask to allow it to be semiconductive, a source electrode and a drain electrode are formed from a part of the conductive amorphous oxide film which does not overlap the gate electrode, whereby a top-gate type field effect transistor can be produced.

In the production method of the invention, a source electrode and a drain electrode are formed, a conductive amorphous oxide film is formed on the source electrode and the drain electrode, an insulating film is formed on the conductive amorphous oxide film, a gate electrode is formed on the insulating film using patterns of the source electrode and the drain electrode as a mask, and the conductive amorphous oxide film is crystallized by heating to allow it to be semiconductive, whereby a top-gate field effect transistor can be produced.

According to the invention, it is possible to obtain a field effect transistor which has a small parasitic capacitance, suffers a small variation in properties, experiences a small change over time, and has high reliability. By decreasing the parasitic capacitance, accuracy and speed of the circuit operation can be improved.

BRIEF DESCRIPTION OF THE DRAWINGS

FIG. 5A is a view showing a step of the method for producing a transistor of Embodiment 5;
FIG. 5B is a view showing a step of the method for producing a transistor of Embodiment 5;
FIG. 5C is a view showing a step of the method for producing a transistor of Embodiment 5;
FIG. 5D is a view showing a step of the method for producing a transistor of Embodiment 5;
FIG. 5E is a view showing a step of the method for producing a transistor of Embodiment 5;
FIG. 5F is a view showing a step of the method for producing a transistor of Embodiment 5;
FIG. 5G is a view showing a step of the method for producing a transistor of Embodiment 5;
FIG. 8A is a view showing a step of the method for producing a transistor of Embodiment 8;
FIG. 8B is a view showing a step of the method for producing a transistor of Embodiment 8;
FIG. 8C is a view showing a step of the method for producing a transistor of Embodiment 8;
FIG. 8D is a view showing a step of the method for producing a transistor of Embodiment 8;
FIG. 8E is a view showing a step of the method for producing a transistor of Embodiment 8;
FIG. 8F is a view showing a step of the method for producing a transistor of Embodiment 8;
FIG. 8G is a view showing a step of the method for producing a transistor of Embodiment 8.

BEST MODE FOR CARRYING OUT THE INVENTION

In the field effect transistor of the invention, the gate electrode is self-aligned with the source/drain electrodes. Such a transistor can be produced by patterning the source/drain electrodes by using as a mask the gate electrode which has been prepared before, or, such a transistor can be produced by patterning the gate electrode using as a mask the source/drain electrodes which have been prepared before.

For example, the following methods or the like can be used.
(i) The gate electrode is heated to allow a part of the conductive oxide film which overlaps the gate electrode to be semiconductive, and a part of the conductive oxide film which does not overlap the gate electrode is allowed to be source/drain electrodes (Embodiments 1, 6 and 7).
(ii) By using the gate electrode as a photomask, the source/drain electrodes are patterned by photolithography (Embodiment 2).
(iii) By using the gate electrode as a photomask, the source/drain electrodes are patterned by the lift-off process (Embodiments 3, 4 and 5).
(iv) By using the source/drain electrodes as a photomask, the gate electrode is patterned by the lift-off process (Embodiment 8).

In particular, in the method (i), since the composition of the source/drain electrodes is the same as that of the gate electrode, the process can be simplified by reducing the frequency of the film formation. Further, contact resistance of the source/drain electrodes with the semiconductor layer can be reduced.

In the method (ii), since photolithography is used, it is possible to obtain a transistor having a higher working accuracy as compared with other methods.

Embodiment 9 shows a transistor in which the gate electrode is self-aligned with the protective film of a semiconductor layer.

Embodiment 1

[Bottom-Gate Type Self-Aligned Transistor]

In this embodiment, by heating the gate electrode, a part of the conductive amorphous oxide film which overlaps the gate electrode is allowed to be semiconductive (crystallized) to form a semiconductor layer. A part which does not overlap the gate electrode retains its conductivity and becomes the source/drain electrodes. As a result, a self-aligned field effect transistor can be formed. The semiconductor layer and the source/drain electrodes have the same composition.

FIGS. 1A to F each show a step of the method for producing a transistor of Embodiment 1.

(1) Substrate

Figure 1A:
FIG. 1A is a view showing a step of the method for producing a transistor of Embodiment 1.

A substrate 101 provided with an undercoating film (not shown) is prepared (FIG. 1A).

As the undercoating film, a single layer of an insulating layer such as a silicon oxide film, a silicon nitride film, a silicon oxynitride film (SiOxNy) (x>y), a silicon nitroxide film (SiNxOy) (x>y) or the like or a stack of these films can be used. The undercoating film can be formed by a sputtering method, a CVD method or the like. The undercoating film may or may not be provided, but it is preferable to form it. By forming an undercoating film, it is possible to suppress transmission of a heat generated from electrodes, wirings or the like formed on the undercoating film to the substrate 101. As the undercoating film, a silicon nitroxide film with a film thickness of 10 to 400 nm can be used, for example.

(2) Formation of a Gate Electrode

Figure 1B:
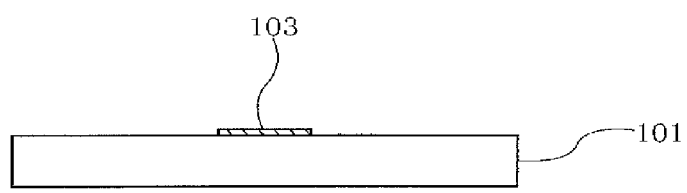
FIG. 1B is a view showing a step of the method for producing a transistor of Embodiment 1.

Subsequently, a gate electrode 103 is formed on the undercoating film (FIG. 1B).

A gate electrode is formed in a film thickness of 50 to 300 nm by the sputtering method, for example.

(3) Gate Insulating Film

Figure 1C:
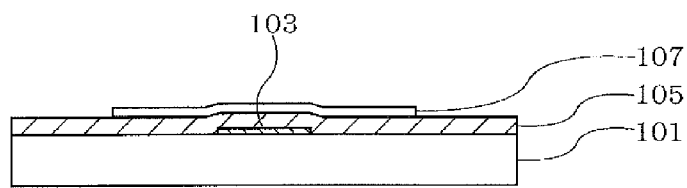
FIG. 1C is a view showing a step of the method for producing a transistor of Embodiment 1.

A gate insulating film 105 for covering the electrode (for example, one with a film thickness of about 50 to 500 nm) is formed (FIG. 1C). The gate insulating film 105, which can be formed by the sputtering method or various CVD methods such as the plasma CVD method, is a single layer or a stack of films containing an oxide of silicon or a nitride of silicon. Specifically, a film containing silicon oxide (SiOx), a film containing silicon oxynitride (SiOxNy) or a film containing silicon nitroxide (SiNxOy) is formed as a single film or by appropriately stacking these layers.

Further, by subjecting the gate electrode to a high-density plasma treatment in an atmosphere containing oxygen, nitrogen, or both oxygen and nitrogen, the surface of the gate electrode 103 is oxidized or nitrided to form a gate insulating film. A high-density plasma treatment can make a gate insulating film which is improved in uniformity of film thickness, film quality or the like, and has excellent density. As an atmosphere containing oxygen, a mixed gas of oxygen ($O_2$), nitrogen dioxide ($NO_2$) or dinitrogen monoxide ($N_2O$) with a dilute gas, or a mixed gas of oxygen ($O_2$), nitrogen dioxide ($NO_2$) or dinitrogen monoxide ($N_2O$) with a dilute gas and hydrogen ($H_2$) can be used. As an atmosphere containing nitrogen, a mixed gas of nitrogen ($N_2$) or ammonium ($NH_3$) with a dilute gas, or a mixed gas of nitrogen ($N_2$) or ammonium ($NH_3$) with a dilute gas and hydrogen ($H_2$) can be used. Due to an oxygen radical (it may contain an OH radical) or a nitrogen radical (it may contain a NH radical) generated by high-density plasma, the surface of the gate electrode may be oxidized or nitrided.

When a gate insulating film is formed by conducting a high-density plasma treatment, a high-density plasma treatment is conducted such that an insulating film of 1 to 20 nm, typically 5 to 10 nm, covers the gate electrode. Since the reaction in this treatment is a solid-phase reaction, the interfacial level density between the gate insulating film and the gate electrode can be significantly reduced. Further, since the gate electrode is directly oxidized or nitrided, the thickness of the gate insulating film formed can be uniform.

That is, by subjecting the surface of the electrode to a solid phase oxidization by a high-density plasma treatment, it is possible to form an insulating film with good uniformity and a low interfacial level density. In this case, an oxide of an element selected from tantalum (Ta), tungsten (W), titanium (Ti), molybdenum (Mo), chromium (Cr) and niobium (Nb), an or an alloy or compound material composed of these elements as a main component functions as a gate insulating film.

As the gate insulating film, only an insulating film formed by a high-density plasma treatment may be used. In addition to such an insulating film, an insulating film containing silicon oxide, silicon nitride containing oxygen, silicon oxide containing nitrogen may be deposited by the CVD method using a plasma or thermal reaction to form a stack. In a transistor in which an insulating film formed by high-density plasma occupies part or all of the gate insulating film, a variation in properties can be rendered small.

As the gate insulating film, alumina ($Al_2O_3$), aluminum nitride (AlN), titanium oxide ($TiO_2$), zirconia ($ZrO_2$), lithium oxide ($Li_2O$), potassium oxide ($K_2O$), sodium oxide ($Na_2O$), indium oxide ($In_2O_3$), yttrium oxide ($Y_2O_3$), calcium zirconate ($CaZrO_3$), which are in good conformity with the oxide semiconductor layer or a material containing at least two of them can be used. A gate insulating film can be formed as a single layer or a stack of two or more layers.

(4) Formation of Amorphous Oxide Film

After sending to a sputtering chamber without breaking vacuum, an amorphous oxide film 107 is formed in a thickness of about 5 to 200 nm (FIG. 1C).

As the film forming method, chemical film forming methods such as the spray method, the dipping method and the CVD method, or physical film forming methods such as the sputtering method, the vacuum vapor deposition method, the ion plating method and the pulse laser deposition method. In respect of easiness in controlling the carrier density and easiness in improving film quality, it is preferable to use a physical film forming method. The sputtering method is more preferably used in respect of high productivity.

As the sputtering method used in this embodiment, the DC sputtering method, the RF sputtering method, the AC sputtering method, the ECR sputtering method, the opposing target sputtering method or the like can be given. The DC sputtering method, the AC sputtering method, the ECR sputtering method and the opposing sputtering method or the like are preferable.

As for the sputtering method, the co-sputtering method and the reactive sputtering method may be used.

The DC sputtering and the AC sputtering have high productivity and are capable of lowering the carrier concentration easily. In the ECR sputtering method and the opposing target sputtering method, film quality can be controlled easily, interface can be prevented from deterioration caused by film formation, current leakage can be suppressed and properties of an oxide semiconductor layer such as an on-off ratio can be improved.

Specific film forming conditions when the sputtering method is used as the film forming method will be described below.

The distance between the target and the substrate (S-T distance) during sputtering is normally 150 mm or less, preferably 110 mm or less, and particularly preferably 80 mm or less.

If the S-T distance is in the above-mentioned distance range, when the target contains a divalent metal element, activation of a positive divalent metal element can be expected due to the exposure of the substrate to plasma during sputtering. When the S-T distance exceeds 150 mm, the film forming speed may become too slow to be industrially applicable.

The ultimate pressure is normally $5 \times 10^{-2}$ Pa or less, preferably $5 \times 10^{-3}$ Pa or less, more preferably $5 \times 10^{-4}$ Pa or less, further preferably $1 \times 10^{-4}$ Pa or less, and particularly preferably $5 \times 10^{-5}$ Pa or less.

If the ultimate pressure exceeds $5 \times 10^{-2}$ Pa, a large amount of hydrogen atoms may be supplied from $H_2O$ or the like in the atmospheric gas, and the mobility of the oxide semiconductor layer may be lowered. The reason therefor is assumed to be as follows. The crystal structure of the oxide semiconductor layer is changed by hydrogen atoms supplied.

The partial oxygen pressure of the atmospheric pressure during sputtering is normally $40 \times 10^{-3}$ Pa or less, preferably $15 \times 10^{-3}$ Pa or less, more preferably $7 \times 10^{-3}$ Pa or less, and particularly preferably $1 \times 10^{-3}$ Pa or less.

If the partial oxygen pressure in the atmospheric gas exceeds $40 \times 10^{-3}$ Pa, the mobility of the oxide semiconductor film may be lowered and the carrier concentration may be unstable. The reason therefor is assumed to be as follows. If the partial oxygen pressure is too high (if the concentration of oxygen is too high) in the atmospheric gas during film formation, the number of oxygen atoms taken between crystal lattice of the oxide semiconductor film is increased to cause oxygen atoms to scatter or to cause oxygen atoms to remove easily from the film to allow the oxide semiconductor film to be stable.

The concentration of $H_2O$ and $H_2$ in the atmospheric gas during sputtering is normally 1.2 vol % or less, preferably 1.0 vol % or less, more preferably 0.1 vol % or less and particularly preferably 0.01 vol % or less.

If the concentration of $H_2O$ and $H_2$ in the atmospheric gas exceeds 1.2 vol %, the mobility may be lowered.

During sputtering, in order to attain uniform film formation, methods such as rotating a folder to which a substrate is fixed and moving a magnet to broaden the erosion range can be taken.

(5) Allowing the Film to be Semiconductive (Crystallization)

Figure 1D:
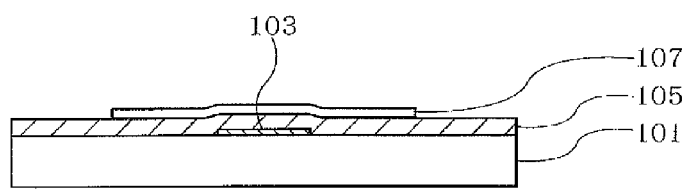
FIG. 1D is a view showing a step of the method for producing a transistor of Embodiment 1.
Figure 1E:
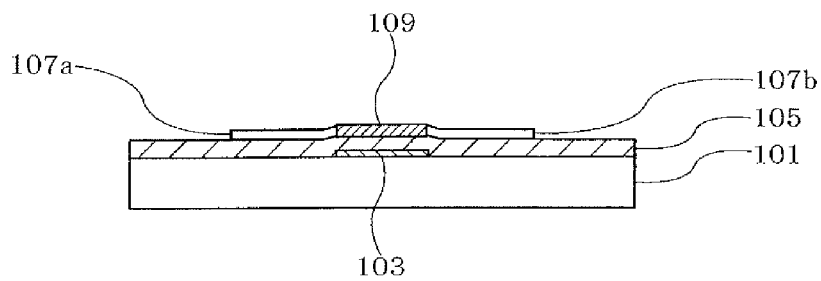
FIG. 1E is a view showing a step of the method for producing a transistor of Embodiment 1.

By heating the gate electrode 103, the amorphous oxide film 107 is allowed to be semiconductive to form a semiconductor layer 109 (FIGS. 1D and 1E).

Since the amorphous oxide film is conductive, it can be formed into a source electrode and a drain electrode as it is. That is, one of the parts of the amorphous oxide film 107 which are not allowed to be semiconductive becomes a source electrode 107a and the other becomes a drain electrode 107b, whereby a field effect transistor is formed. Although the amorphous oxide film is conductive in this embodiment, the amorphous oxide film may not be conductive. In this case, later, the amorphous oxide films 107a and 107b are subjected to a treatment for decreasing the resistance thereof.

Figure 1F:
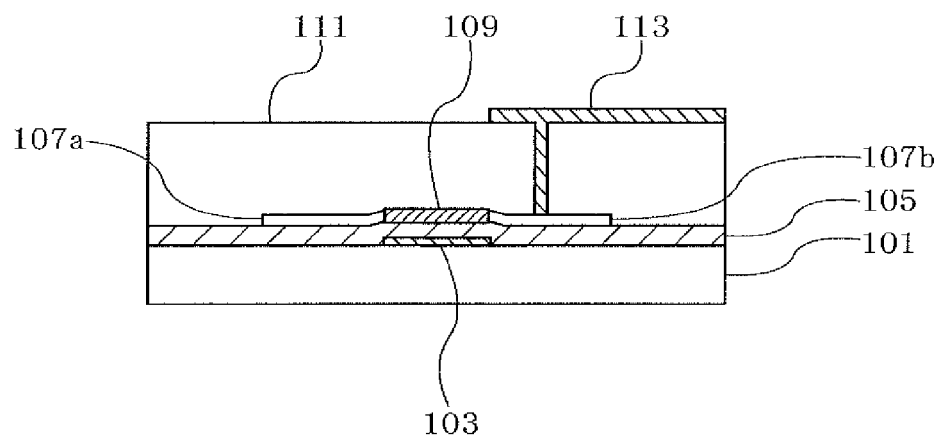
FIG. 1F is a view showing a step of the method for producing a transistor of Embodiment 1.

As shown in FIG. 1F, it is preferred that a semiconductor layer 109 be sealed by a protective film 111. In FIG. 1F, the pixel electrode 113 is connected to the drain electrode 107b through the protective film 111. Without the protective film, the properties may be adversely affected by a process environment or an environment during use, and hence, deteriorated.

Embodiment 2

[Bottom-Gate Type Self-Aligned Transistor]

This embodiment differs from Embodiment 1 in that the transistor having the same shape as that of Embodiment 1 is produced by photolithography using the gate electrode as a mask. In this embodiment, the gate electrode is not heated. Also in this embodiment, the semiconductor layer and the source/drain electrodes have the same composition.

FIGS. 2A to 2E each show a step of the method for producing a transistor of Embodiment 2.

Figure 2A:
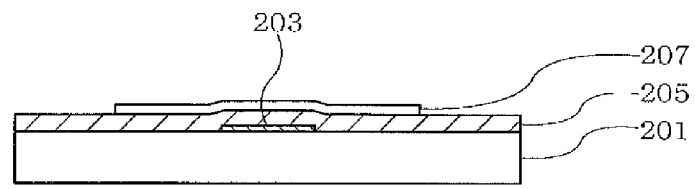
FIG. 2A is a view showing a step of the method for producing a transistor of Embodiment 2.
Figure 2B:
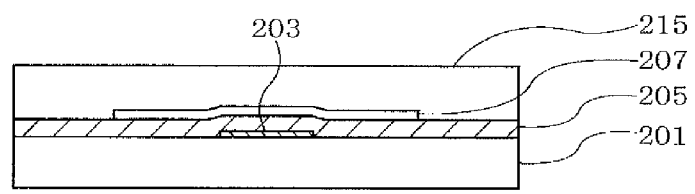
FIG. 2B is a view showing a step of the method for producing a transistor of Embodiment 2.
Figure 2C:
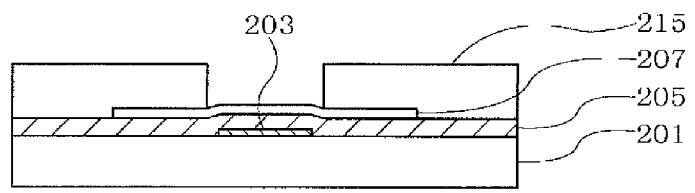
FIG. 2C is a view showing a step of the method for producing a transistor of Embodiment 2.

In the same manner as in Embodiment 1, on a substrate 201, a gate electrode 203, a gate insulating film 205 and an amorphous oxide film 207 are formed (FIG. 2A). Further, a resist 215 is applied (FIG. 2B). Subsequently, using a gate electrode 203 as a mask, light is irradiated from below the gate electrode 203, and the resist 215 is developed and removed, whereby the part above the gate electrode 203 is opened (FIG. 2C).

Subsequently, an amorphous oxide film 207 in the opening of the resist 201 is allowed to be semiconductive. It is preferred that the amorphous film be allowed to be semiconductive by crystallizing the amorphous film. If the oxide film is allowed to be semiconductive with the film being in the amorphous state, the amorphous non-semiconductor part and the amorphous semiconductor part at the interface becomes uniform with time. Further, if the film thickness is too large, it may take too long time to allow it to be semiconductive with the film being in the amorphous.

Figure 2D:
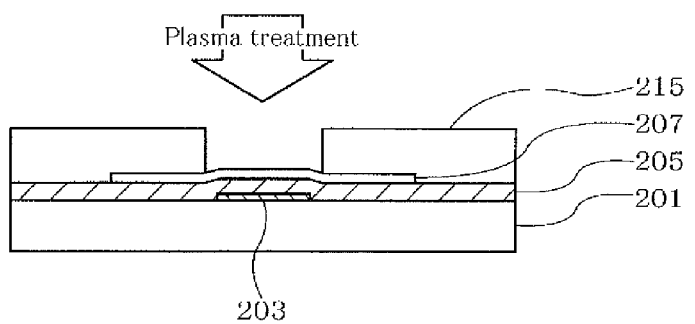
FIG. 2D is a view showing a step of the method for producing a transistor of Embodiment 2.
Figure 2E:
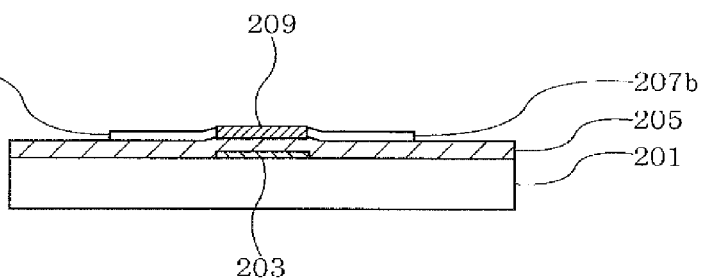
FIG. 2E is a view showing a step of method for producing a transistor of Embodiment 2.

An amorphous film is subjected to a plasma treatment to allow it to be semiconductive, whereby a semiconductor layer 209 is formed (see FIGS. 2D and 2E). The amorphous film can be allowed to be semiconductive by a laser irradiation treatment or the like. As in the case of Embodiment 1, of the parts of the amorphous oxide film 207 which are not allowed to be semiconductive, one becomes a source electrode 207a and the other becomes a drain electrode 207b, whereby a field effect transistor is formed (FIG. 2E).

Embodiment 3

[Bottom-Gate Type Self-Aligned Transistor]

In this embodiment, a transistor is formed by a lift off process by using a gate electrode as a mask.

FIGS. 3A to F are each a view showing a step of the method for producing a transistor of Embodiment 3.

Figure 3A:
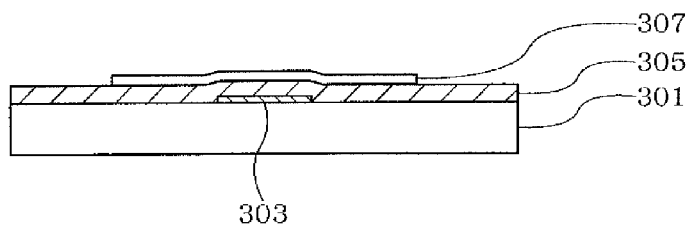
FIG. 3A is a view showing a step of the method for producing a transistor of Embodiment 3.
Figure 3B:
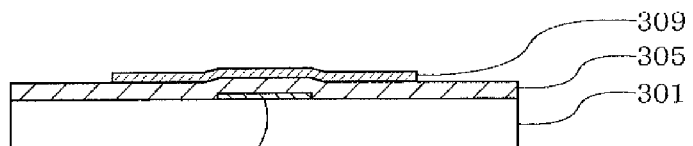
FIG. 3B is a view showing a step of the method for producing a transistor of Embodiment 3.
Figure 3C:
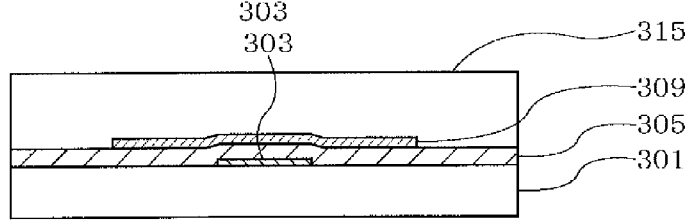
FIG. 3C is a view showing a step of the method for producing a transistor of Embodiment 3.
Figure 3D:
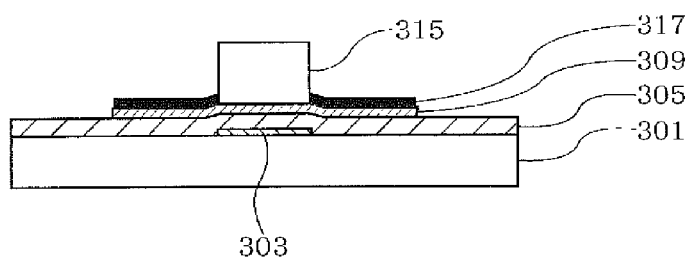
FIG. 3D is a view showing a step of the method for producing a transistor of Embodiment 3.
Figure 3E:
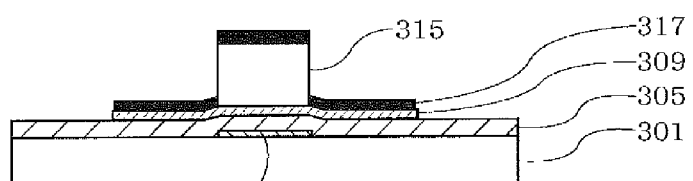
FIG. 3E is a view showing a step of the method for producing a transistor of Embodiment 3.
Figure 3F:
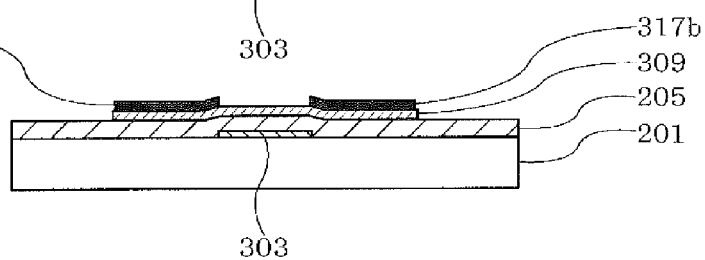
FIG. 3F is a view showing a step of the method for producing a transistor of Embodiment 3.
Figure 10:
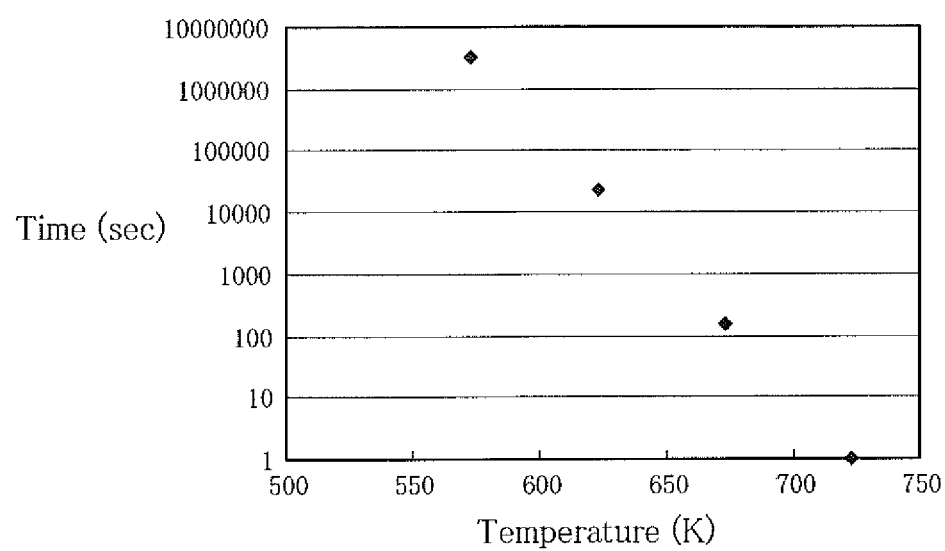
FIG. 10 is a view showing the relationship between the temperature and the time during annealing.

As in the case of Embodiment 1, on a substrate 301, a gate electrode 303, a gate insulating film 305 and an amorphous oxide film 307 are formed (FIG. 3A). Subsequently, the amorphous oxide film 307 is allowed to be semiconductive (crystallized) 309 (FIG. 3B). Allowing the amorphous oxide film to be semiconductive can be conducted by annealing by means of an electric furnace or the like. The relationship between the temperature and the time during the annealing is shown in FIG. 10. Based on this relationship, an appropriate treatment temperature and an appropriate treatment time can be selected. Thereafter, a resist 315 is applied, and using the gate electrode 303 as a mask, light is irradiated from below the gate electrode 303 (FIG. 3C). The resist 315 is developed to remove a resist other than that above the gate electrode 303 (FIG. 3D). After a conductive film 317 is formed thereon (FIG. 3E), the resist 315 is removed, whereby a source electrode 317a and a drain electrode 317b are formed (FIG. 3F).

The lift off process has a problem that high precise processing or fine processing is difficult, and there may be a case that the overlapping of the source electrode 317a and the drain electrode 317b with the gate electrode 303 becomes large.

Embodiment 4

[Bottom-Gate Type Self-Aligned Transistor]

This embodiment differs from Embodiment 3 in that a protective film is formed on the amorphous oxide film.

FIGS. 4A to G are each a view showing a step of the method for producing a transistor of Embodiment 4.

Figure 4A:
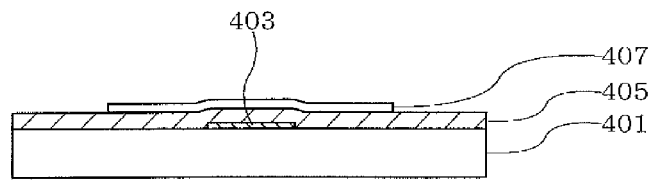
FIG. 4A is a view showing a step of the method for producing a transistor of Embodiment 4.
Figure 4B:
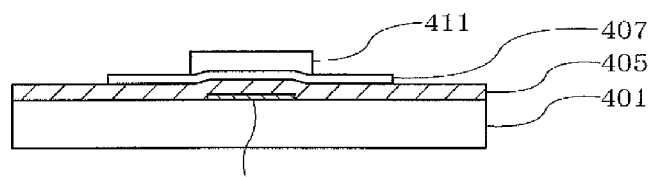
FIG. 4B is a view showing a step of the method for producing a transistor of Embodiment 4.
Figure 4C:
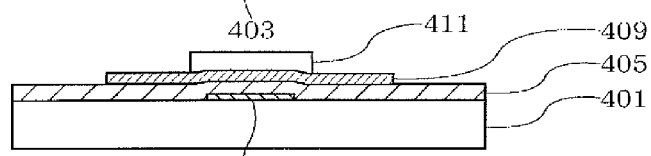
FIG. 4C is a view showing a step of the method for producing a transistor of Embodiment 4.
Figure 4D:
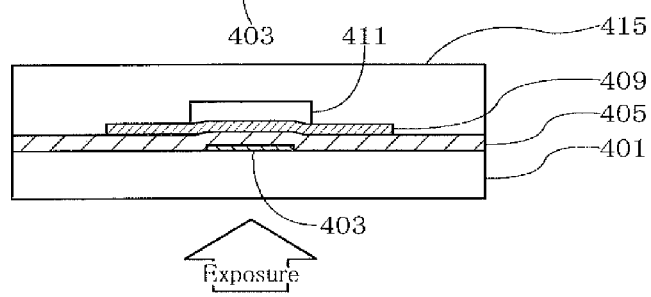
FIG. 4D is a view showing a step of the method for producing a transistor of Embodiment 4.
Figure 4E:
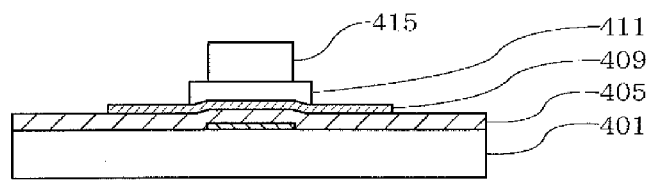
FIG. 4E is a view showing a step of the method for producing a transistor of Embodiment 4.
Figure 4F:
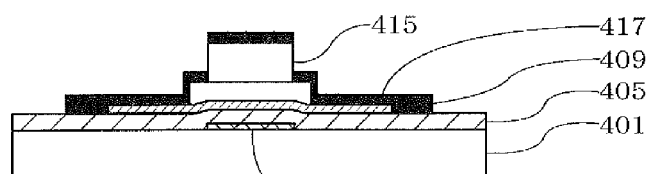
FIG. 4F is a view showing a step of the method for producing a transistor of Embodiment 4.
Figure 4G:
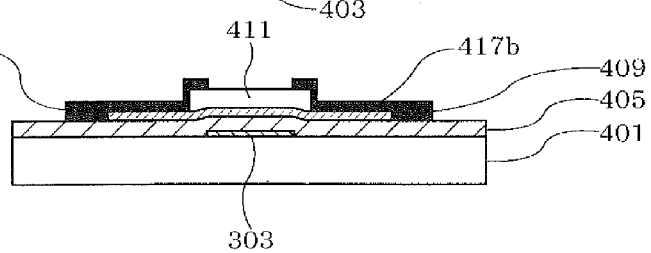
FIG. 4G is a view showing a step of the method for producing a transistor of Embodiment 4.

As in the case of Embodiment 1, on a substrate 401, a gate electrode 403, a gate insulating film 405 and an amorphous oxide film 407 are formed (FIG. 4A). Further, a protective film 411 is formed on the amorphous oxide film 407 (FIG. 4B). Subsequently, as in the case of Embodiment 3, the amorphous oxide film 407 is allowed to be semiconductive (crystallized) 409 (FIG. 4C). Thereafter, a resist 415 is applied, and light is irradiated using the gate electrode 403 as a mask (FIG. 4D). The resist 415 is developed to remove a resist other than that above the gate electrode 403 (FIG. 4E). After forming a conductive film 417 thereon (FIG. 4F), the resist 415 is peeled off, whereby a source electrode 417a and a drain electrode 417b are formed (FIG. 4G).

Embodiment 5

[Bottom-Gate Type Self-Aligned Transistor]

In this embodiment, a transistor is formed by a lift off process by using a gate electrode as a mask.

FIGS. 5A to G are each a view showing a step of the method for producing a transistor of Embodiment 5.

On a substrate 501, a gate electrode 503 is formed (FIG. 5A), and a gate insulating film 505 and a resist 515 are stacked thereon, followed by light exposure (FIG. 5B). The resist is developed to remove a resist other than that above the gate electrode 503 (FIG. 5C), and then a conductive film 517 is formed (FIG. 5D). The resist 515 is peeled off, whereby a source electrode 517a and a drain electrode 517b are formed (FIG. 5E).

A conductive amorphous oxide film 507 is formed thereon (FIG. 5F), and the amorphous oxide film is then allowed to be semiconductive (crystallized) 509 (FIG. 5G). In this embodiment, since a semiconductor layer 509 is finally formed, only slight defects are generated at the interface between the semiconductor layer 509 and the source electrode 517a/drain electrode 517b/insulating film 505 (that is, the threshold voltage can be rendered low).

Embodiment 6

[Top-Gate Type Self-Aligned Transistor]

In this embodiment, by heating a gate electrode, part of a conductive amorphous oxide film which overlaps the gate electrode is allowed to be semiconductive (crystallized) to form a semiconductor layer. Part which does not overlap the gate electrode keeps conductivity and becomes source/drain electrodes. The semiconductor layer and the source electrode/drain electrodes have the same composition.

FIGS. 6A to G are each a view showing a step of the method for producing a transistor of Embodiment 6.

Figure 6A:
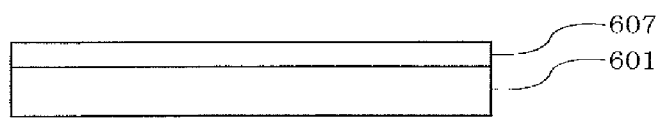
FIG. 6A is a view showing a step of the method for producing a transistor of Embodiment 6.
Figure 6B:
FIG. 6B is a view showing a step of the method for producing a transistor of Embodiment 6.
Figure 6C:
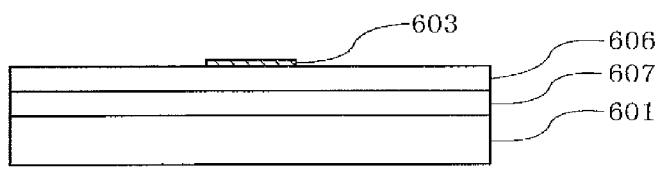
FIG. 6C is a view showing a step of the method for producing a transistor of Embodiment 6.
Figure 6D:
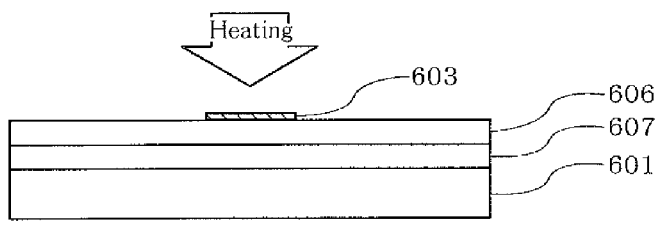
FIG. 6D is a view showing a step of the method for producing a transistor of Embodiment 6.
Figure 6E:
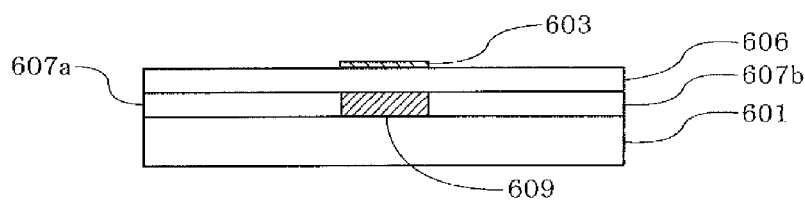
FIG. 6E is a view showing a step of the method for producing a transistor of Embodiment 6.
Figure 6F:
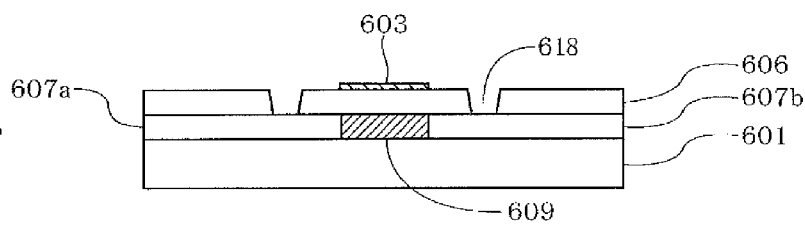
FIG. 6F is a view showing a step of the method for producing a transistor of Embodiment 6.
Figure 6G:
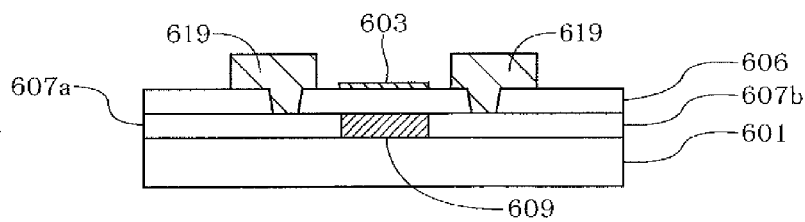
FIG. 6G is a view showing a step of the method for producing a transistor of Embodiment 6.

On a substrate 601, a conductive amorphous oxide film 607 is formed (FIG. 6A). An insulating film 606 is formed thereon (FIG. 6B). Further, a gate electrode 603 is formed (FIG. 6C), and heating is conducted using the gate electrode 603 as a mask (FIG. 6D). In FIG. 6D, heating is conducted from above. However, heating may be conducted from below the substrate 601. The amorphous oxide film 607 below the gate electrode 603 is allowed to be semiconductive (crystallized) to become a semiconductor layer 609. On the both sides thereof, a source electrode 607a and a drain electrode 607b are respectively formed (FIG. 6E). A contact hole 618 is formed (FIG. 6F), and wirings 619 for the source electrode 607a and the drain electrode 607b are provided, whereby a transistor (coplanar structure) is completed (FIG. 6G).

Embodiment 7

[Top-Gate Type Self-Aligned Transistor]

This embodiment is the same as that of Embodiment 6, except for the wiring positions of a source electrode and a drain electrode.

FIGS. 7A to F are each a view showing a step of the method for producing a transistor of Embodiment 7.

Figure 7A:
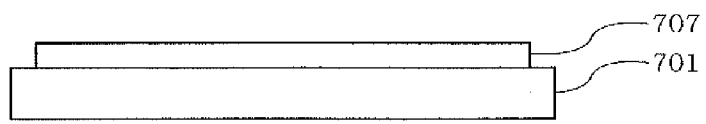
FIG. 7A is a view showing a step of the method for producing a transistor of Embodiment 7.
Figure 7B:
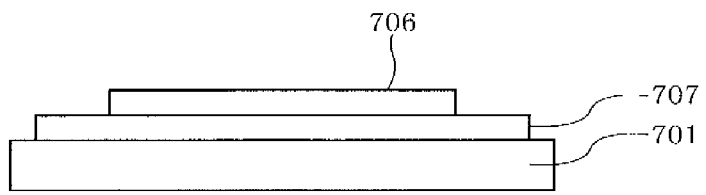
FIG. 7B is a view showing a step of the method for producing a transistor of Embodiment 7.
Figure 7C:
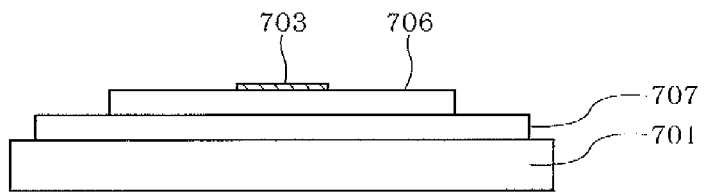
FIG. 7C is a view showing a step of the method for producing a transistor of Embodiment 7.
Figure 7D:
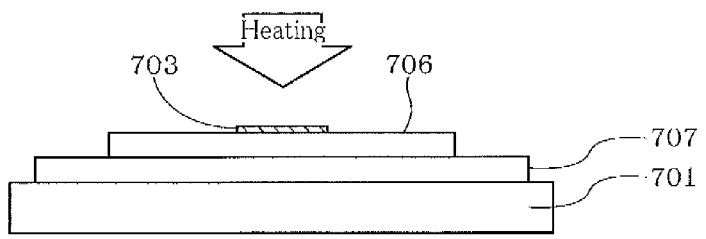
FIG. 7D is a view showing a step of the method for producing a transistor of Embodiment 7.
Figure 7E:
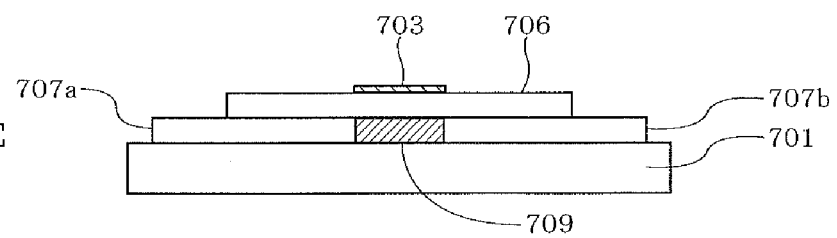
FIG. 7E is a view showing a step of the method for producing a transistor of Embodiment 7.
Figure 7F:
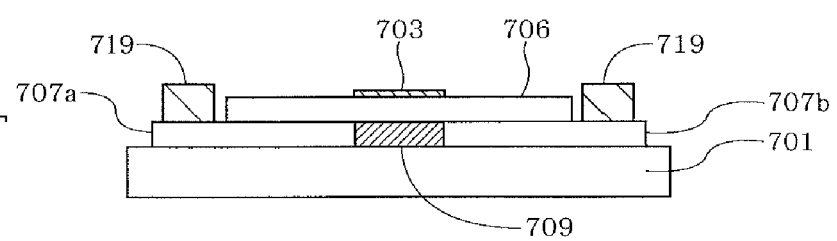
FIG. 7F is a view showing a step of the method for producing a transistor of Embodiment 7.

On a substrate 701, a conductive amorphous oxide film 707 is formed (FIG. 7A), and an insulating film 706 is formed thereon (FIG. 7B). Further, a gate electrode 703 is formed (FIG. 7C), and heating is conducted using the gate electrode 703 as a mask (FIG. 7D). In FIG. 7D, heating is conducted from above However, heating may be conducted from below the substrate 701. The amorphous oxide film 707 below the gate electrode 703 is allowed to be semiconductive (crystallized) to form a semiconductor layer 709. On the both sides thereof, a source electrode 707a and a drain electrode 707b are respectively formed (FIG. 7E). Wirings 719 for the source electrode 707a and the drain electrode 707b are respectively provided on the edges of the insulating film 705, whereby a transistor (coplanar structure) is completed (FIG. 7F).

Embodiment 8

[Top-Gate Type Self-Aligned Transistor]

In this embodiment, a transistor is formed by a lift off process by using a gate electrode as a mask.

FIGS. 8A to G are each a view showing a step of the method for producing a transistor of Embodiment 8.

On a substrate 801, a source electrode 821 and a drain electrode 823 are formed (FIG. 8A), and a conductive amorphous oxide film 807 and an insulating film 806 are formed thereon (FIG. 8B). Thereafter, a resist 815 is applied, and light is irradiated using the source electrode 821 and the drain electrode 823 as a mask (FIG. 8C). The resist 815 is developed and removed, and an opening is provided between the source electrode 821 and the drain electrode 823 (FIG. 8D). On this opening, a conductive layer 825 is provided (FIG. 8E), and the resist 815 is peeled off to form a gate electrode 825a (FIG. 8F). Further, heating is conducted to allow the amorphous oxide film 807 to be semiconductive (crystallized) 809 (FIG. 8G). Allowing the amorphous oxide film to be semiconductive can be conducted by using annealing by means of an electric furnace or the like. The relationship between the temperature and the time during the annealing is shown in FIG. 10. Based on this relationship, an appropriate treatment temperature and an appropriate treatment time can be selected.

The lift off process has a problem that high precise processing is difficult, and there may be a case that the overlapping of the source electrode 821 and the drain electrode 823 with the gate electrode 825a becomes large.

Embodiment 9

FIGS. 9A to J are each a view showing a step of the method for producing a transistor of Embodiment 9.

Figure 9A:
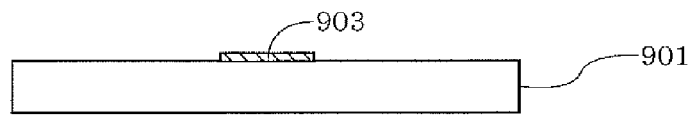
FIG. 9A is a view showing a step of the method for producing a transistor of Embodiment 9.
Figure 9B:
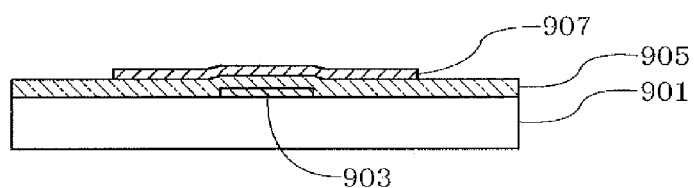
FIG. 9B is a view showing a step of the method for producing a transistor of Embodiment 9.
Figure 9C:
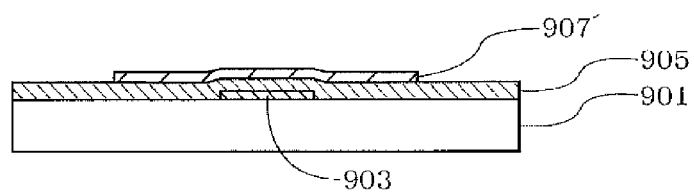
FIG. 9C is a view showing a step of the method for producing a transistor of Embodiment 9.
Figure 9D:
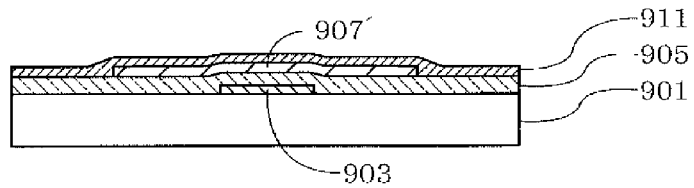
FIG. 9D is a view showing a step of the method for producing a transistor of Embodiment 9.
Figure 9E:
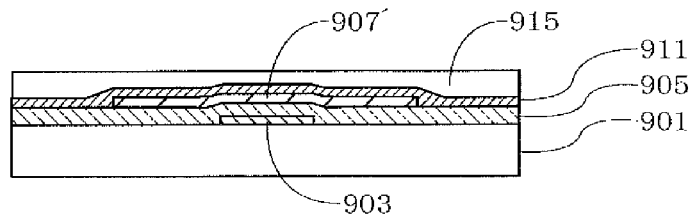
FIG. 9E is a view showing a step of the method for producing a transistor of Embodiment 9.
Figure 9F:
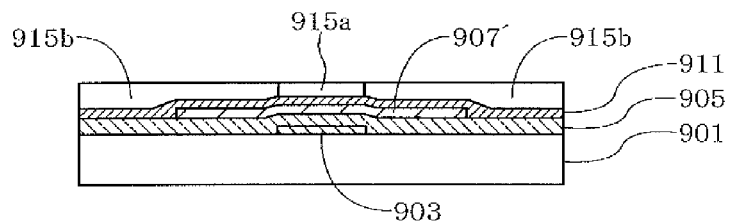
FIG. 9F is a view showing a step of the method for producing a transistor of Embodiment 9.
Figure 9G:
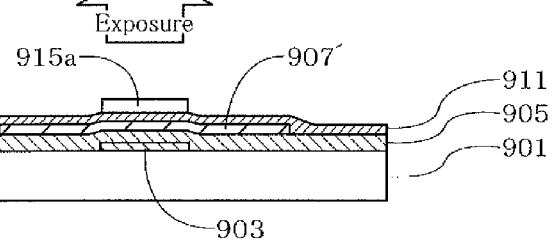
FIG. 9G is a view showing a step of the method for producing a transistor of Embodiment 9.
Figure 9H:
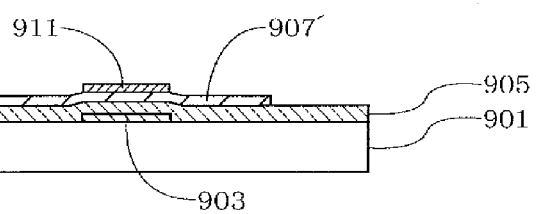
FIG. 9H is a view showing a step of the method for producing a transistor of Embodiment 9.
Figure 9I:
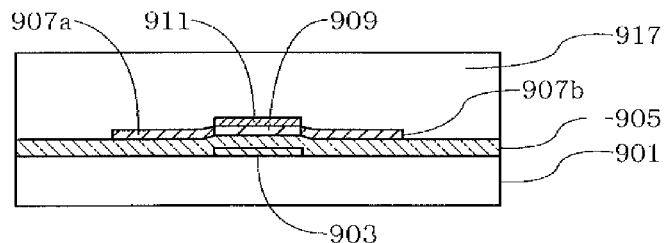
FIG. 9I is a view showing a step of the method for producing a transistor of Embodiment 9.
Figure 9J:
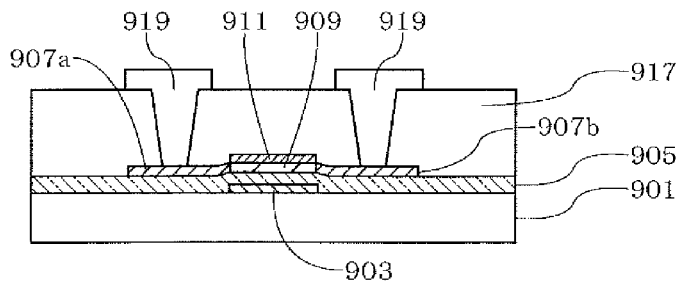
FIG. 9J is a view showing a step of the method for producing a transistor of Embodiment 9.

In this embodiment, at first, a gate electrode 903 is formed on a supporting substrate 901 (FIG. 9A). A gate insulating film 905 is formed so as to cover the gate electrode 903, and an amorphous oxide film 907 is formed on the gate insulating film 905 (FIG. 9B). The amorphous oxide film 907 is crystallized by a heat treatment or the like to form a semiconductor layer 907' (FIG. 9C). A first protective film 911 (oxides such as SiOx are preferable) is formed (FIG. 9D). On the first protective film 911, a resist 915 is stacked (FIG. 9E). For this stack, light exposure from the supporting substrate 901 using the gate electrode 903 as a mask and removal of the resist (part indicated by numeral 915b) are conducted, whereby the resist is patterned into a desired shape (numeral 915a in FIGS. 9F and 9G). After the resist is patterned, the first protective film 911 is etched (it is preferred that wet etching be conducted with hydrofluoric acid or the like) to pattern the first protective film 911 into a desired shape, and the resist 915a is removed (FIG. 9H). The resistance of part of the semiconductor layer 907' is lowered, whereby a channel part 909 and source/drain parts 907a and 907b are formed in the semiconductor layer. Further, a second protective film 917 is formed (FIG. 9I). As for the formation of the second protective film 917, it is particularly preferable to form an SiNx:H film or the like by PECVD, since the resistance of part of the semiconductor can be lowered simultaneously with the formation of the second protective film. The second protective film 917 may be formed after the resistance of the semiconductor layer 907' is lowered by UV irradiation or the like. Subsequently, source/drain electrodes 919 are formed in a contact hole, whereby a field effect transistor is formed (FIG. 9J).

When the first protective film 911 is subjected to wet etching, a treatment time can be shortened as compared with dry etching, and as a result, cost reduction can be realized.

As for the etching of the protective film on the semiconductor, the selection ratio of the semiconductor containing an oxide and the protective film provided thereon (etching rate of the protective film/etching rate of the semiconductor containing an oxide) is preferably 2 or more, more preferably 5 or more, further preferably 10 or more, with 20 or more being particularly preferable. A higher selection ratio enables etching of the protective film while exerting a smaller damage on the semiconductor. In addition, a margin (allowable range) of etching time can be increased.

A hydrofluoric acid-based solution is preferable as a wet etching solution used in wet etching. If a wet etching solution containing hydrofluoric acid is used, an oxide film such as silicon oxide (SiOx) or a nitride film such as SiNx (including SiNx:H) can be etched. Further, since the etching rate is high, a hydrofluoric acid-based solution is suitable for etching an oxide film which is difficult to be etched by other wet etching solutions, silicon oxide (SiOx), in particular.

A hydrofluoric acid is commercially available normally in the form of an aqueous solution with a concentration of about 47 wt %. It is preferable to dilute it so that it can be used at a concentration of 0.1 to 10 wt %, more preferably 0.5 to 7.5 wt %, with 1 to 5 wt % being particularly preferable. If the concentration is 10 wt % or less, the rate at which glass is molten becomes slow, which enables a glass substrate to be used. Further, a hydrofluoric acid may be used in the form of a buffer solution with ammonium fluoride (BHF: Buffered HF). A BHF is preferable, since the pH of a BHF can be kept constant. A constant pH enables good reproducibility of conditions.

As for the above-mentioned buffer solution, it is preferred that it contain 8 to 35 wt % of ammonium fluoride and 0.1 to 10 wt % of hydrofluoric acid. Within this range, there are advantages that the etching rate is increased, etching is possible at a lower etching solution temperature, or the like.

As the wet etching solution, one having an etching rate of 50 to 450 nm for SiOx at 30° C. is preferable, with an etching rate of 70 to 300 nm being more preferable. With this range, etching can be conducted at an etching rate suited to the tact time.

It is preferred that a surfactant be added to a wet etching solution containing hydrofluoric acid. Addition of a surfactant is preferable since uniformity in etching is improved.

Etching temperature is preferably 5 to 50° C., more preferably 10 to 35° C., with 15 to 30° C. being particularly preferable. Within the above-mentioned temperature range, an etching rate can be adjusted easily to an appropriate level. In addition, temperature control can be realized by using simple facilities.

EXAMPLES

Example 1

A field effect transistor of Embodiment 1 was prepared.
(1) Substrate
A non-alkaline glass substrate with an SiNx undercoating film was prepared.
(2) Formation of a Gate Electrode
An MoW film (200 nm) was formed by magnetron DC sputtering.
In order to improve adhesiveness or the like, the film was treated with hexamethyldisilazane (HMDS). Thereafter, application of a resist, prebaking, light exposure using a mask with a gate electrode pattern, development (TMAH) and post baking were conducted for patterning.
After etching with a reactive ion etching (RIE), the resist was removed.
(3) Formation of a Gate Insulating Film and an Amorphous Oxide Film
An SiNx gate insulating film (200 nm) was formed by plasma chemical vapor deposition (PECVD).
Subsequently, without breaking vacuum, this film was sent to a sputtering chamber. An $In_2O_3$—ZnO film (In:Zn=97:3 in atomic ratio, 25 nm) was formed by magnetron DC sputtering.
The resulting film was an amorphous conductive film having a specific resistance of $4 \times 10^{-4}$ Ωcm.
Further, the amorphous oxide film was patterned by photolithography and by wet etching using an oxalic acid-based etching solution.
The specific resistance was measured by the four probe method. The film was confirmed to be amorphous by XRD.
(4) Allowing the Film to be Semiconductive (Crystallization)
A high-output, broad-area semiconductor laser apparatus with a wavelength of 808 nm was used. In this laser apparatus, a light source which can give a light output of about 4 W by continuous oscillation was used. A laser beam emitted from the above-mentioned semiconductor laser apparatus was passed through a uniform lightening optical system using microlens arrays or the like, and the beam was changed into a rectangular beam of which the light intensity profile on the long axis side was of flat-top hat type and the light intensity profile on the short axis side was of Gaussian type. This beam was condensed and irradiated on the gate electrode. The substrate was moved at a constant speed. The gate electrode was heated by irradiation of a semiconductor laser beam, and this heat was transmitted by thermal conduction to the gate insulating film and the amorphous oxide film, which were the layers above the gate electrode, and the temperature of the amorphous oxide film reached the crystallization temperature. The amorphous oxide film of which the temperature reached the crystallization temperature was subjected to solid phase crystallization, whereby the above-mentioned crystalline semiconductor layer was formed. The reason therefor is assumed to be a decrease in carrier density due to activation of Zn as a dopant, which was caused by activation by heat.
The film obtained was a semiconductor layer having a specific resistance of $4 \times 10^3$ Ωcm. As a result of X-ray diffraction analysis and observation by means of a scanning electron microscope (TEM), it was confirmed that the crystal of the semiconductor layer was a polycrystalline oxide having a bixbite structure.
The resulting film had a band gap of 3.7 eV.
The surface roughness (RMS) measured by AMP was 0.4 nm.
If the hall effect was measured while changing the measurement temperature within a range of 77 to 300K, it was found that the film was a nondegenerate semiconductor which showed thermal activity. The hall effect was measured by means of a hall measurement apparatus (Resi Test 8310, manufactured by Toyo Technica Co., Ltd.) at 0.5[T] and an AC magnetic field.
(5) Field Effect Transistor
A field effect transistor (thin film transistor) with a W/L of 4 (W=20 μm, L=5 μm) which was provided with a source electrode, a drain electrode, a gate electrode, an insulating film and a semiconductor layer formed of a crystalline oxide was obtained. Overlapping of the source electrode or the drain electrode with the gate electrode was 0.4 μm, and the source electrode and the drain electrode were self-aligned with the gate electrode.
The mobility of the field effect transistor was 12 $cm^2$/Vs, variations in current value (σ/average value of Ion) was 1.6% and a Vth shift (Vg=15V, 50° C., 24 hours) was 0.1 V. In addition, sufficient pressure resistance properties were obtained.
Properties of the field effect transistor were evaluated as follows.
Mobility
Using a semiconductor parameter analyzer (Keithley 4200), the mobility was measured at room temperature and in the light-shielded environment.
Variation in Current Value
A variation in on current Ion (σ/average value of Ion) of adjacent 16 transistors were measured at plural points of the substrate, and the average was taken as the variation of the current value.
Vth Variation
A voltage of 15V was applied to a gate electrode, and a change in Vth when the transistor was driven for 24 hours at 50° C. was taken as the Vth variation.

Example 2

A field effect transistor of Embodiment 2 was prepared and evaluated using the same material and by the same method as in Example 1. The results are shown in Table 1.
As the resist 215, Nega (a transmitting part is insoluble) was used. Exposure was conduced by an ultra-high pressure mercury optical system using a stepper exposure method.
A plasma treatment was conducted by a RF low-temperature plasma treatment. By conducting a plasma treatment, the conductive amorphous oxide film was allowed to be semiconductive and crystallized. As a result of X-ray diffraction analysis and observation by means of a scanning electron microscope (TEM), it was confirmed that the crystal of the semiconductor layer was a polycrystalline oxide having a bixbite structure.

Example 3

A field effect transistor of Embodiment 3 was prepared and evaluated using the same material and method as in Examples 1 and 2, except that Posi (a transmitting part is soluble) was used as the resist 315. The results are shown in Table 1.

As the conductive film (the source electrode, the drain electrode), an Mo/Al/Mo film was used.

Example 4

A field effect transistor of Embodiment 4 was prepared and evaluated using the same material and method as in Examples 1 to 3. The results are shown in Table 1.
As the protective film, silicon oxide was used.

Example 5

A field effect transistor of Embodiment 5 was prepared and evaluated using the same material and method as in Examples 1 to 4. The results are shown in Table 1.

Example 6

A field effect transistor of Embodiment 6 was prepared and evaluated using the same material and method as in Examples 1 to 5. The results are shown in Table 1.

Example 7

A field effect transistor of Embodiment 7 was prepared and evaluated using the same material and method as in Examples 1 to 6. The results are shown in Table 1.

Example 8

A field effect transistor of Embodiment 8 was prepared and evaluated using the same material and method as in Examples 1 to 7. The results are shown in Table 1.

Referential Example 1

A field effect transistor of Embodiment 9 was prepared and evaluated using the same material and method as in Examples 1 to 7. The results are shown in Table 1.
As the first protective film, an SiOx film was formed by PECVD, and as the second protective film, an SiNx:H film was formed by PECVD. The resistance of the semiconductor layer was lowered simultaneously with the formation of the SiNx:H film by PECVD, thereby to form source/drain parts. Etching of the first protective film was conducted by wet etching using a hydrofluoric acid-based etching solution.
The transistor of Referential Example 1 had improved moisture proof as compared with those of Examples 1 to 8. The reason therefor is assumed to be caused by stacking of an SiNx:H film as the second protective film.

Referential Example 2

A field effect transistor was prepared and evaluated in the same manner as in Referential Example 1, except that, as the amorphous oxide film (which is allowed to be a semiconductor layer by crystallization), an $In_2O_3$ film was used instead of the $In_2O_3$—ZnO film (In:Zn=97:3 atomic ratio). As a result, almost the same results as in Examples 1 to 8 and Referential Example 1 were obtained except that the Vth value was slightly decreased and the off current was slightly increased.

Referential Example 3

A field effect transistor was prepared and evaluated in the same manner as in Referential Example 1, except that, as the amorphous oxide film (which is allowed to be a semiconductor layer by crystallization), an $In_2O_3$—$Ga_2O_3$ film (In:Ga=97:3 atomic ratio) film was used instead of the $In_2O_3$—ZnO film (In:Zn=97:3 atomic ratio). As a result, variations in current value or Vth decreased, namely, the transistor properties were improved as compared with Examples 1 to 8 and Referential Example 1. Other transistor properties were almost the same as those in Examples 1 to 8 and Referential Example 1.

Referential Example 4

A field effect transistor was prepared and evaluated in the same manner as in Referential Example 1, except that, as the amorphous oxide film (which is allowed to be a semiconductor layer by crystallization), an $In_2O_3$—ZnO—$SnO_2$ film (In:Zn:Sn=97:2.5:0.5 atomic ratio) film was used instead of the $In_2O_3$—ZnO film (In:Zn=97:3 atomic ratio). As a result, mobility increased, namely, the transistor properties were improved as compared with Examples 1 to 8 and Referential Example 1. Other transistor properties were almost the same as those in Examples 1 to 8 and Referential Example 1.

Comparative Example 1

An amorphous silicon field effect transistor described in Table 1 (Paragraph 0031) of Patent Document 1 (JP-A-2007-5508) was prepared. This transistor is not self-aligned. The evaluation results are shown in Table 1.

Comparative Example 2

In the same manner as described in the third example (paragraphs 0042 to 0045) of Patent Document 1 (JP-A-2007-5508), a finely crystallized silicon field effect transistor was prepared. This transistor is not self-aligned. The evaluation results are shown in Table 1.

TABLE 1

| | Example | | | | | | | | | Com. Ex. | |
|---|---|---|---|---|---|---|---|---|---|---|---|
| | 1 | 2 | 3 | 4 | 5 | 6 | 7 | 8 | S1 | 1 | 2 |
| W (μm) | 20 | 20 | 20 | 20 | 20 | 20 | 20 | 20 | 20 | 20 | 20 |
| L (μm) | 5 | 5 | 20 | 20 | 20 | 5 | 5 | 20 | 5 | 5 | 5 |
| Overlapping of S/D and gate electrode (μm) | 0.4 | <0.2 | 2.1 | 2.1 | 2.3 | <0.2 | <0.2 | 2.2 | <0.2 | 3.5 | 3.5 |
| Mobility (cm$^2$/Vs) | 12 | 12 | 11 | 13 | 4 | 12 | 12 | 6 | 12 | 0.5 | 2 |
| Variation in current value (%) | 1.1 | 0.9 | 1.4 | 1.2 | 1.6 | 1.1 | 1.1 | 1.5 | 0.7 | 1.8 | 2.5 |
| Vth variation (V) | 0.1 | 0.1 | 0.2 | 0.1 | 0.2 | 0.1 | 0.1 | 0.2 | 0.1 | 15 | 0.3 |

S1: Referential Example 1

INDUSTRIAL APPLICABILITY

The field effect transistor of the invention can be applied to integrated circuits such as a logical circuit, a memory circuit, and a differential amplification circuit. In particular, the field effect transistor can be preferably used as a switching element for driving a liquid crystal display or an organic EL display.

The invention claimed is:

1. A field effect transistor comprising:
a source electrode,
a drain electrode,
a gate electrode,
an insulating film and
a semiconductor layer containing a crystalline oxide configured to have a pattern according to the gate electrode,
wherein the source electrode and the drain electrode are aligned with the gate electrode with the insulating film therebetween,
the source electrode and the drain electrode are comprised of a conductive amorphous oxide film which has the same composition as that of the semiconductor layer, and
the source electrode, the drain electrode and the semiconductor layer form one continuous layer.

2. The field effect transistor according to claim 1, wherein the semiconductor layer is between the source electrode and the drain electrode.

3. The field effect transistor according to claim 1, wherein the source electrode and the drain electrode are self-aligned with the gate electrode with the insulating film and the semiconductor layer therebetween.

4. The field effect transistor according to claim 1, wherein the semiconductor layer is on the source electrode and the drain electrode.

5. The field effect transistor according claim 1, which has a coplanar structure.

6. The field effect transistor according to claim 1, wherein the crystalline oxide comprises at least In.

7. The field effect transistor according to claim 1, wherein the crystalline oxide is a composite oxide which comprises In and a positive divalent element or a positive trivalent element.

8. The field effect transistor according to claim 1, wherein the crystalline oxide has a bixbite structure.

9. A semiconductor apparatus which comprises the field effect transistor according to claim 1 and comprises a conductor which is in contact with the source electrode or the drain electrode of the field effect transistor.

10. A field effect transistor comprising:
a gate electrode;
a semiconductor layer containing a crystalline oxide formed from a portion of a conductive amorphous oxide film overlapping the gate electrode;
a source electrode and a drain electrode formed from the conductive amorphous oxide film and aligned to not overlap the gate electrode by the portion comprising the semiconductor layer, wherein the source electrode, the drain electrode and the semiconductor layer form one continuous layer; and
an insulating film configured between the gate electrode and the conductive amorphous oxide film.

11. The field effect transistor according to claim 1, wherein the semiconductor layer has the same shape as a shape of the gate electrode.

12. The field effect transistor according to claim 10, wherein the semiconductor layer has the same shape as a shape of the gate electrode.

13. The field effect transistor according to claim 1, wherein overlapping of the source electrode or the drain electrode with the gate electrode is 3.0 µm or less, and there is no gap in an alignment between the source electrode or the drain electrode, and the gate electrode.

14. The field effect transistor according to claim 10, wherein overlapping of the source electrode or the drain electrode with the gate electrode is 3.0 µm or less, and there is no gap in an alignment between the source electrode or the drain electrode, and the gate electrode.

15. The field effect transistor according to claim 1, wherein the drain electrode is connected to a pixel electrode.

16. The field effect transistor according to claim 15, further comprising a protective film to seal the semiconductor layer, wherein the drain electrode is connected to the pixel electrode through the protective film.

17. The field effect transistor according to claim 1, wherein the semiconductor layer is in contact with the source electrode and the drain electrode.

18. A method for producing the field effect transistor of claim 1 comprising:
forming a gate electrode;
forming an insulating film on the gate electrode;
forming a conductive amorphous oxide film on the insulating film; and
heating the gate electrode using as a mask a pattern of the gate electrode to crystallize a part of the conductive amorphous oxide film which overlaps the gate electrode to allow it to be semiconductive, and to form the source electrode and the drain electrode from a part of the conductive amorphous oxide film which does not overlap the gate electrode.

19. A method for producing the field effect transistor of claim 1 comprising:
forming a conductive amorphous oxide film;
forming an insulating film on the conductive amorphous oxide film;
forming a gate electrode on the insulating film; and
heating the gate electrode using as a mask a pattern of the gate electrode to crystallize a part of the conductive amorphous oxide film which overlaps the gate electrode to allow it to be semiconductive, and to form the source electrode and the drain electrode from a part of the conductive amorphous oxide film which does not overlap the gate electrode.

20. A method for producing the field effect transistor of claim 1 comprising a step of heating the gate electrode from 200 degrees Celsius to 1400 degrees Celsius and, by using heat transmitted from the gate electrode, subjecting at least part of a conductive amorphous oxide film to solid-phase crystallization to allow it to be semiconductive.

* * * * *